(12) United States Patent
Kim et al.

(10) Patent No.: US 11,513,151 B2
(45) Date of Patent: Nov. 29, 2022

(54) TEST HANDLER AND SEMICONDUCTOR DEVICE EQUIPMENT INCLUDING SAME

(71) Applicant: Samsung Electronics Co., Ltd., Suwon-si (KR)

(72) Inventors: Yeong Seok Kim, Cheonan-si (KR); Suk Byung Chae, Cheonan-si (KR); Dong Soo Lee, Cheonan-si (KR); Sang Ho Jang, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 71 days.

(21) Appl. No.: 17/211,385

(22) Filed: Mar. 24, 2021

(65) Prior Publication Data

US 2022/0026485 A1 Jan. 27, 2022

(30) Foreign Application Priority Data

Jul. 22, 2020 (KR) .................. 10-2020-0090699

(51) Int. Cl.
*G01R 31/28* (2006.01)
(52) U.S. Cl.
CPC ..... *G01R 31/2875* (2013.01); *G01R 31/2877* (2013.01); *G01R 31/2893* (2013.01)
(58) Field of Classification Search
CPC ............ G01R 31/2808; G01R 31/2862; G01R 31/2863; G01R 31/2867; G01R 31/2874; G01R 31/2875; G01R 31/2877; G01R 31/2893
USPC ..................................... 324/750.13
See application file for complete search history.

(56) References Cited

U.S. PATENT DOCUMENTS

| | | | |
|---|---|---|---|
| 8,272,230 B2 | 9/2012 | Nakamura | |
| 10,281,521 B2 | 5/2019 | Song et al. | |
| 2006/0181265 A1* | 8/2006 | Saito ................. | G01R 31/2891 324/756.02 |
| 2016/0061884 A1* | 3/2016 | Cho .................. | G01R 31/2875 324/750.13 |

FOREIGN PATENT DOCUMENTS

| | | | | |
|---|---|---|---|---|
| CN | 101107723 A | * | 1/2008 | ............. F25B 21/02 |
| JP | 2001-116800 A | | 4/2001 | |
| JP | 2005030829 A | | 2/2005 | |
| JP | WO2009118855 A1 | | 7/2011 | |

(Continued)

*Primary Examiner* — Jermele M Hollington
*Assistant Examiner* — Courtney G McDonnough
(74) *Attorney, Agent, or Firm* — Harness, Dickey & Pierce, P.L.C.

(57) ABSTRACT

A test handler includes a pusher which includes a pusher end which comes into contact with a DUT (Device Under Test) to transfer heat, and a pusher body which conducts heat to the pusher end, the pusher end separating a test tray for fixing the DUT and the pusher body from each other; a porous match plate including a pusher arrangement region in which the pusher body is placed, and a plurality of holes placed adjacent to the pusher arrangement region; a heater placed on an upper surface of the porous match plate to control temperature of the pusher; and an airflow input port placed on the heater to provide the airflow to the plurality of holes, in which the airflow passes through the plurality of holes and passes through a separated space between the test tray and the pusher body.

20 Claims, 19 Drawing Sheets

(56) References Cited

FOREIGN PATENT DOCUMENTS

| | | |
|---|---|---|
| KR | 2006-0100189 A | 9/2006 |
| KR | 10-2008-0086320 A | 9/2008 |
| KR | 20090061028 A | 6/2009 |
| KR | 20110001855 A | 1/2011 |
| KR | 10-2013-0099781 A | 9/2013 |
| KR | 20140141405 A | 12/2014 |

* cited by examiner

TEST HANDLER AND SEMICONDUCTOR DEVICE EQUIPMENT INCLUDING SAME

CROSS-REFERENCE TO RELATED APPLICATION

This application claims priority from Korean Patent Application No. 10-2020-0090699 filed on Jul. 22, 2020 in the Korean Intellectual Property Office, and all the benefits accruing therefrom under 35 U.S.C. 119, the contents of which in its entirety are herein incorporated by reference.

BACKGROUND

1. Field

Example embodiments relate to a test handler and/or a semiconductor element test device including the same.

2. Description of the Related Art

In fabrication of electronic components such as integrated circuit elements, performance inspections such as an electrical performance and a thermal stress are performed on a packaged integrated circuit element (hereinafter referred to as a 'semiconductor element'). In particular, as an example of a device for inspecting the performance such as an electrical performance and a thermal stress of the mentioned semiconductor element, there is a test handler that is a device that may test a plurality of semiconductor elements in a harsh environment of a high temperature and a low temperature.

As demands for higher functionality, higher speed, and higher stacking of electronic components increase with the development of the electronic industry, the number of chips stacked in the semiconductor element increases. As a result, a temperature difference occurs between a chip placed at a lower part and a chip placed at an upper part, which makes it difficult to inspect the performance of the semiconductor element at a target temperature. Therefore, there is a need for a test handler for controlling the test temperature, while reducing the temperature difference between the upper and lower parts in the semiconductor element.

Furthermore, due to the tendency of test efficiency increase, there is an increasing demand for testing a plurality of semiconductor elements at once. When testing a plurality of semiconductor elements at once, the test temperature of the semiconductor elements may vary depending on their respective positions, which makes it difficult to inspect the performance of the semiconductor element at the target temperature. Therefore, there is a need for a test handler for controlling the test temperature, while reducing variations in the temperature at different positions at the time of the test operation of the plurality of semiconductor elements.

SUMMARY

Example embodiments of the present disclosure provide a test handler configured to control a test temperature, while reducing a temperature difference inside a semiconductor element.

Example embodiments of the present disclosure also provide a test handler that controls a test temperature, while reducing a temperature difference between a plurality of semiconductor elements.

Example embodiments of the present disclosure also provide a semiconductor element test device that controls the test temperature, while reducing a temperature difference inside the semiconductor element.

Example embodiments of the present disclosure also provide a semiconductor element test device that controls a test temperature, while reducing a temperature difference between a plurality of semiconductor elements.

However, example embodiments of the present disclosure are not restricted to the one set forth herein. The above and other example embodiments of the present disclosure will become more apparent to one of ordinary skill in the art to which the present disclosure pertains by referencing the detailed description of the present disclosure given below.

The test handler according to some example embodiments includes a pusher including a pusher end and a pusher body, the pusher end separating a test tray for fixing a Device Under Test (DUT) and the pusher body from each other, the pusher end configured to come into contact with the DUT to transfer heat, and the pusher body configured to conduct heat to the pusher end; a porous match plate having the pusher body on a pusher arrangement region thereof with a plurality of holes adjacent to the pusher arrangement region; a heater on an upper surface of the porous match plate, the heater configured to control a temperature of the pusher; and an airflow input port on the heater, the airflow input port configured to provide an airflow to the plurality of holes such that the airflow passes through the plurality of holes and through a separated space between the test tray and the pusher body.

The test handler according to some example embodiments includes a plurality of pushers configured to comes into contact with a plurality of Devices Under Test (DUTs) to transfer heat, the plurality of pushers including a first pusher and a second pusher, the first pusher on a central region of a test tray and the second pusher on an outer region of the test tray; a porous match plate having the plurality of pushers on respective ones of a plurality of pusher arrangement regions thereof with a plurality of holes placed between respective ones of the plurality of pusher arrangement regions; a heater including a central heater on the first pusher and an outer heater on the second pusher; and an airflow input port on the heater, the airflow input port configured to provide the airflow to the plurality of holes such that the airflow passes through a space between the central heater and the outer heater and through the plurality of holes to control temperatures of the plurality of pushers.

The semiconductor element test device according to some example embodiments includes a test board configured to electrically connect with a device under test (DUT); a test tray including an input port configured to receive the DUT to fix the DUT to the test board; a pusher including a pusher end and a pusher body, the pusher end separating the test tray from the pusher body, the pusher end configured to penetrate the input port to come into contact with the DUT, the pusher body configured to transfer heat to the DUT through the pusher end; a porous match plate having the pusher body on a pusher arrangement region thereof with a plurality of holes adjacent to the pusher arrangement region; a heater on an upper surface of the porous match plate, the heater configured to control a temperature of the pusher; an airflow input port on the heater, the airflow input port configured to provide airflow to the plurality of holes; and a variable flow tunnel configured to transport the airflow between the airflow input port and the heater such that a length of the variable flow tunnel between the airflow input port and the heater is variable as the airflow passes through the variable flow tunnel, through the plurality of holes, and through a separated space between the test tray and the pusher body.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

Figure 1:
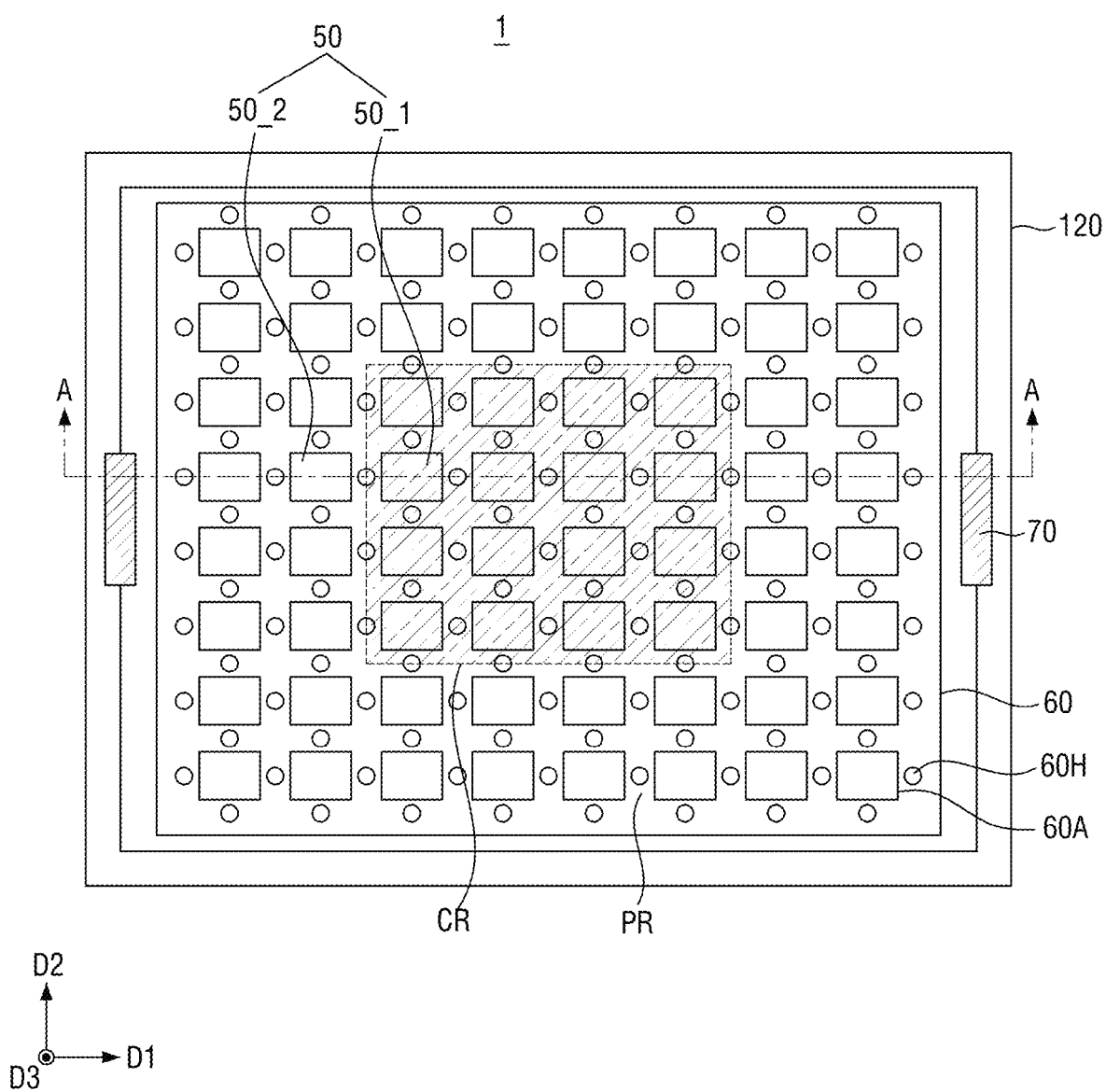
FIG. 1 is a plan view for explaining a semiconductor element test device according to some example embodiments of the present disclosure.

Hereinafter, example embodiments will be described referring to the accompanying drawings. In the explanation of FIGS. 1 to 19, the same reference numerals are used for substantially the same components, and repeated explanation of the components will not be provided. Also, similar reference numerals are used for similar components throughout various drawings of the present disclosure.

Figure 2:
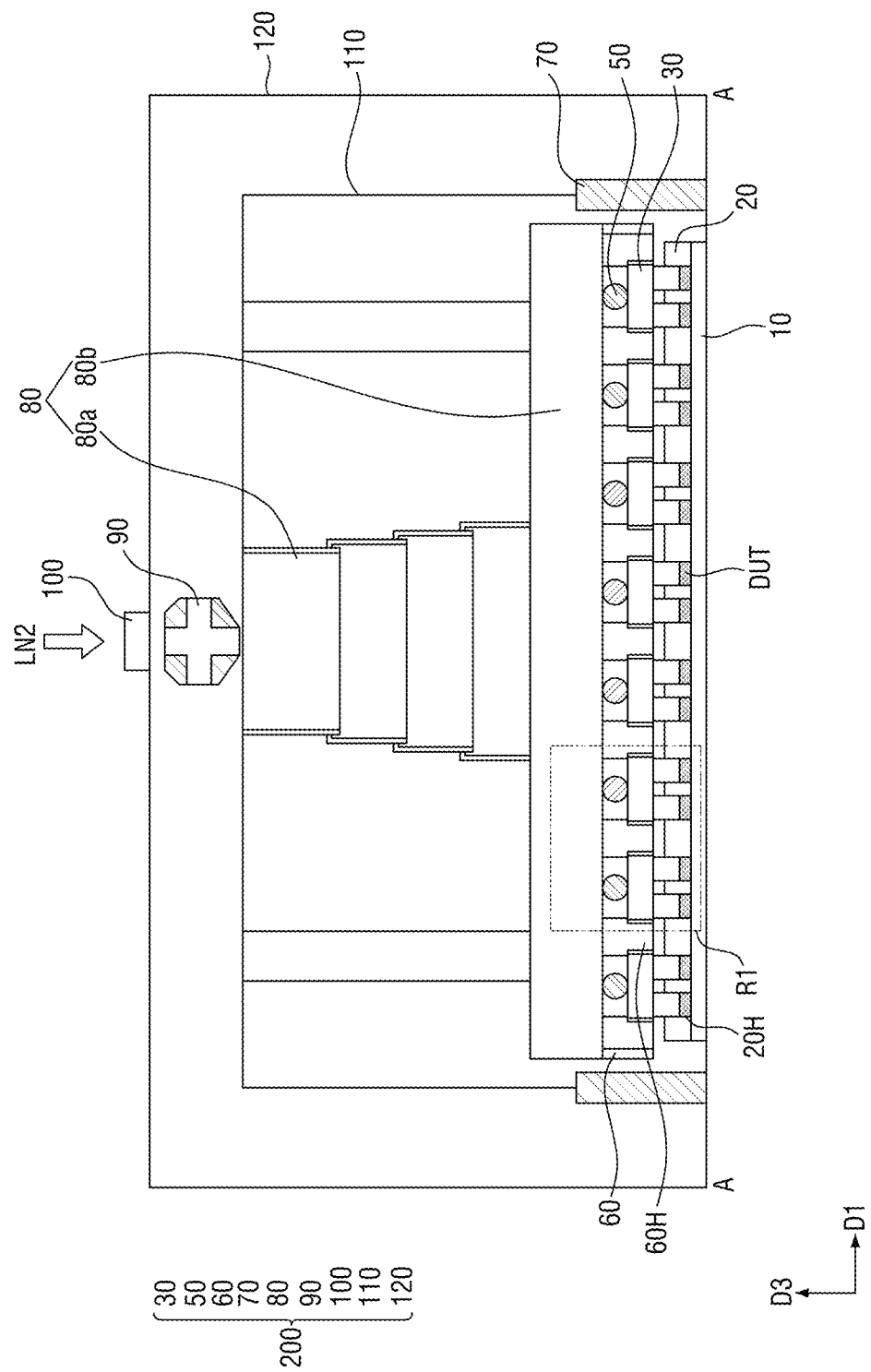
FIG. 2 is a cross-sectional view of the semiconductor element test device of FIG. 1 taken along a line A-A.
Figure 3:
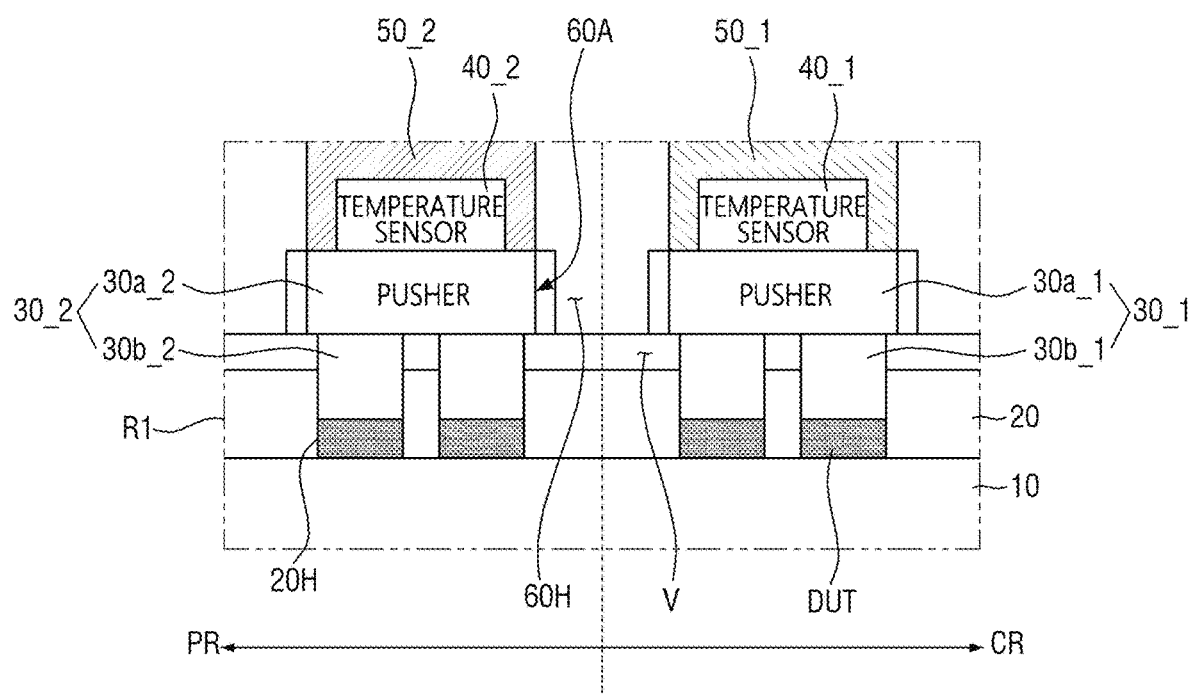
FIG. 3 is an enlarged view of a region R1 of FIG. 2.

FIG. 1 is a plan view for explaining a semiconductor element test device 1 according to some example embodiments of the present disclosure. FIG. 2 is a cross-sectional view of the semiconductor element test device 1 of FIG. 1 taken along a line A-A. FIG. 3 is an enlarged view of a region R1 of FIG. 2. FIG. 1 is a diagram showing a semiconductor element test device 1 from a planar viewpoint mainly on the basis of a heater 50 and a porous match plate 60.

Figure 6:
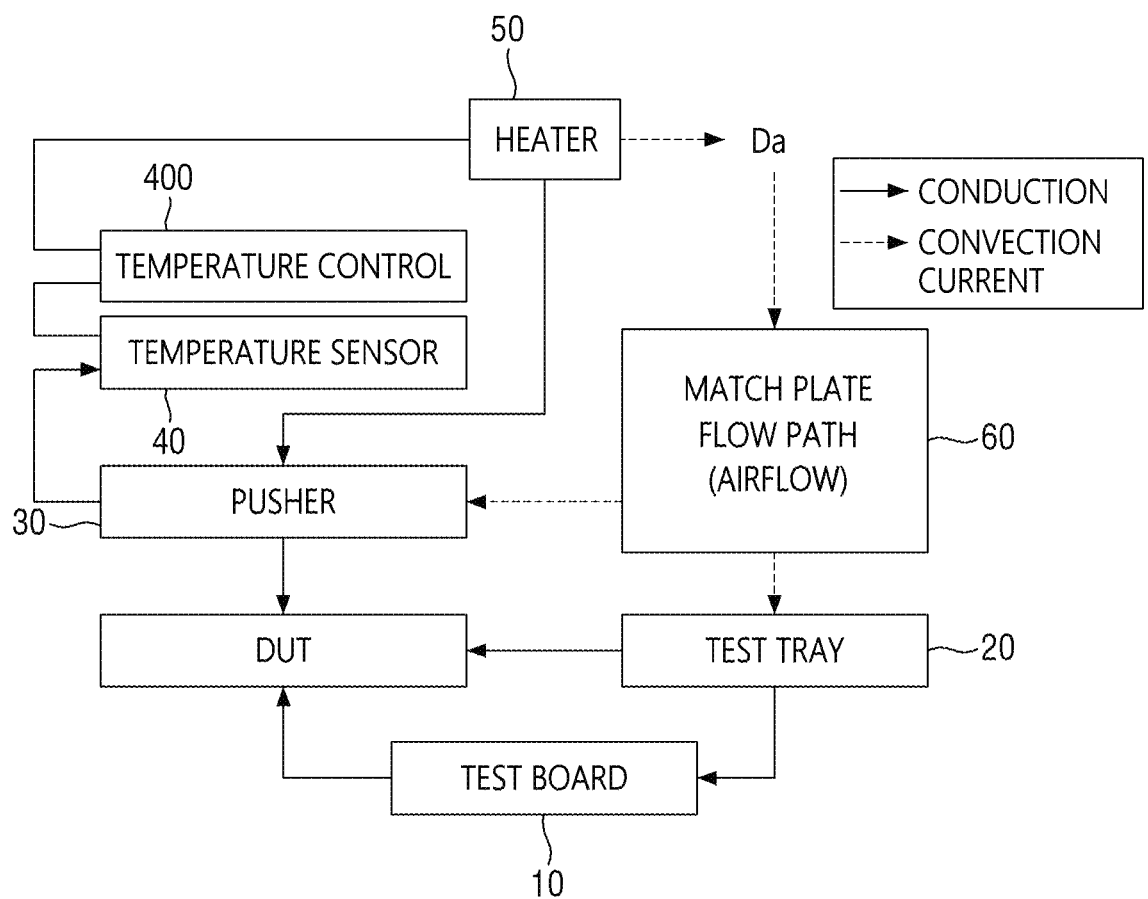
FIG. 6 is a diagram for explaining a temperature control of the semiconductor element test device according to some example embodiments of the present disclosure.

Referring to FIGS. 1 to 3, the semiconductor element test device 1 may include a test board 10, a test tray 20, a test handler 200 and a temperature control 400 (see FIG. 6).

The test board 10 is brought into contact with and electrically connected to a plurality of semiconductor elements corresponding to a plurality of DUTs (Device Under Test), and is electrically connected to a test board (not shown) placed outside the test handler 200. This allows the DUT and a tester (not shown) to send and receive electrical signals for test operation through the test board 10.

The test tray 20 allows the DUT to be fixed to the test board 10 at the time of the test operation, and may include an input port 20H into which the DUT and a pusher end 30b_1, 30b_2 are inserted from a planar viewpoint. The test tray 20 may overlap the test board 10 to be flat except for the input port 20H.

Although not shown, a socket and a socket guide which surrounds the socket may be placed between the test board 10 and the test tray 20 according to an example embodiment, and an electrical connection may be made between the DUT and the test board 10 through the socket.

The test tray 20 may include a central region CR and an outer region PR. In FIG. 1, the central region CR is a region which overlaps sixteen central pushers 30_1 placed at the center among the sixty-four pushers 30, and the outer region PR is a region that overlaps forty-eight outer pushers 30_2 placed at the center among the sixty-four pushers 30.

Figure 5:
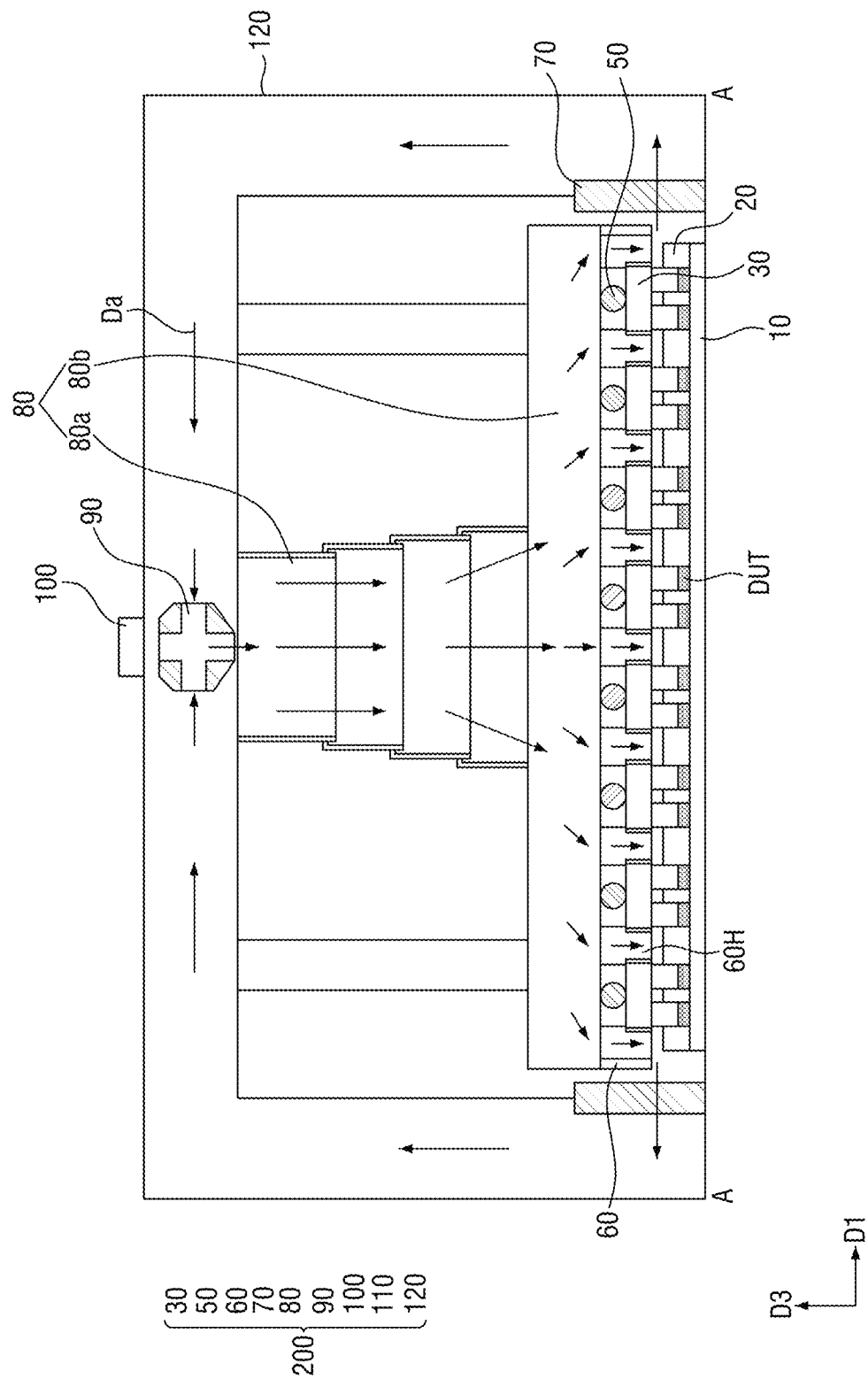

However, although only the central region CR and the outer region PR are shown in the test tray 20 of FIGS. 1 to 3, the region setting as in FIGS. 1 to 3 may change depending on example embodiments, and may change by various factors such as the planar arrangement of the pusher 30, and the temperature and flow velocity of the airflow Da (See FIG. 5). Example embodiments not limited to the examples of FIGS. 1 to 3. For example, an additional outer region may be placed between the central region CR and the outer region PR of the test tray 20.

The test handler 200 may include a pusher 30, a temperature sensor 40, a heater 50, a porous match plate 60, a suction port 70, an internal flow path 80, a bidirectional centrifugal blower 90, an airflow input port 100, an inner wall housing 110 and an outer wall housing 120.

The pusher 30 may bring the DUT and the test tray 20 into close contact with the test board 10. Also, the pusher 30 may transfer heat conducted from the heater 50 to the DUT to control the temperature of the DUT at the time of the test operation.

The pusher 30 may include a metal material having high thermal conductivity, typical examples thereof are Al and Cu and may include a ceramic material having high thermal conductivity according to an example embodiment, and example embodiments are not limited to the aforementioned examples.

The pusher 30 may include a first pusher 30_1 and a second pusher 30_2 according to the planar arrangement, the first pusher 30_1 may be placed on the central region CR of the test tray 20, and the second pusher 30_2 may be placed on the outer region PR of the test tray 20.

The first pusher 30_1 and the second pusher 30_2 may include a first pusher body 30a_1 and a first pusher end 30b_1, and a second pusher body 30a_2 and a second pusher end 30b_2, respectively.

The first and second pusher bodies 30a_1 and 30a_2 may be fixed to the porous match plate 60, and may be placed in the pusher arrangement region 60A of the porous match plate 60 from a planar viewpoint. A first temperature sensor 40_1 and a second temperature sensor 40_2 may be placed on the upper surfaces of each of the first and second pusher bodies 30a_1 and 30a_2, and a central heater 50_1 and an outer heater 50_2 may be placed on the upper surfaces of each of the first and second pusher bodies 30a_1 and 30a_2.

The first and second pusher ends 30b_1 and 30b_2 may be placed on the upper surface of the DUT, and at least some parts of the first and second pusher ends 30b_1 and 30b_2 may be inserted into the input port 20H of the test tray 20. Through the placement of the first and second pusher ends 30b_1 and 30b_2, a separated empty space V may be generated between the test tray 20 and the porous match plate 60, and the airflow DA may pass through the empty space V as will be described later (See FIG. 5).

The temperature sensor 40 may include the first temperature sensor 40_1 and the second temperature sensor 40_2 according to the arrangement. Each of the first temperature sensor 40_1 and the second temperature sensor 40_2 may be placed on the upper surfaces of the respective first and second pusher bodies 30a_1 and 30a_2. Heat may be conducted from the respective first and second pusher bodies 30a_1 and 30a_2. Although not shown, the temperature sensor 40 may be electrically connected to a temperature control 400 located outside the tester handler 200.

The heater 50 may include the central heater 50_1 and the outer heater 50_2, according to the arrangement. Each of the central heater 50_1 and the outer heater 50_2 may be placed on the upper surfaces of the each of first and second pusher bodies 30a_1 and 30a_2. Therefore, the central heater 50_1 and the outer heater 50_2 may be placed on the porous match plate 60 including each of the first and second pusher bodies 30a_1 and 30a_2. Each of the central heater 50_1 and the outer heater 50_2 may conduct heat to the respective first and second pusher bodies 30a_1 and 30a_2 to control the temperature of the pusher 30.

The heater 50 has a configuration capable of performing a heat generation operation, and according to example embodiments, a thermoelectric element may absorb heat or generate heat by the power supply voltage applied from the outside.

Although not shown, the heater 50 may be electrically connected to the temperature control 400 placed outside the tester handler 200.

The central heater 50_1 and the outer heater 50_2 may be spaced apart from each other, and a space separated from each other may also be placed between the central heater 50_1 and the outer heater 50_2.

The porous match plate 60 may include the pusher arrangement region 60A and a hole 60H. The first and second pusher bodies 40a_1 and 40a_2 may be placed and fixed in the pusher arrangement region 60A. The hole 60H may be placed between the pusher arrangement regions 60A. A fluid may pass through the hole 60H.

The porous match plate 60 may be a metal frame that fixes and supports a plurality of pushers 30, and may include metal materials such as an iron-Al alloy and stainless steel. Therefore, according to example embodiments, the configuration of the porous match plate 60 may be placed between the first and second pusher bodies 30a_1 and 30a_2 and the hole 60H.

In FIG. 1, the holes 60H are placed in a staggered arrangement from a planar viewpoint and placed in the form of being staggered with each other. As used herein, the term "staggered arrangement" is used to mean that any two nearest components of the hole 60H are not placed on a straight line along a first direction D1 in which one side wall of the porous match plate 60 extends or a second direction D2 in which the other side wall being in contact with one side wall of the porous match plate 60 extends, and one component is shifted from the other component in a diagonal direction. The above-mentioned staggered arrangement is an example, and unlike the above-mentioned staggered arrangement, the holes 60H may be placed in an aligned arrangement between the pusher arrangement regions 60A.

The suction port 70 is placed on the side wall of the inner wall housing 110, may be placed symmetrically on the basis of the test board 10 and the test tray 20, and may be placed to be spaced apart from each other in the first direction D1. The suction port 70 may suck the airflow inside the inner wall housing 110, and may transfer the sucked airflow to a pipe (not shown) which may be placed between the inner wall housing 110 and the outer wall housing 120.

The internal flow path 80 is a space through which airflow may pass from the outside of the inner wall housing 110 to the space between the porous match plates 60 including the pusher 30, and may include a variable flow path 80a and a fixed flow path 80b.

The variable flow path 80a may control the height of the porous match plate 60, such as a control of a distance between the airflow input port and the heater. The variable flow path 80a is in the form of including a plurality of flow paths with different pipe diameters, and a length at which a plurality of flow paths overlap each other may change when the porous match plate 60 ascends and descends, by inserting the flow path with a small pipe diameter into the flow path with a large pipe diameter.

In some example embodiments, the temperature control 400 may include processing circuitry that may automatically control the ascension and descension of the porous match plate 60 and the diameter of the variable flow path 80a based on, for example, data from the temperature sensor 40.

The fixed flow path 80b is placed below the variable flow path 80a, has a non-changed length, and may transfer the airflow provided from the variable flow path 80a to the porous match plate 60. According to example embodiments, the internal flow path 80 may provide the airflow to the porous match plate 60 through the variable flow path 80a without the fixed flow path 80b.

The bidirectional centrifugal blower 90 may suck the airflow discharged from the suction port 70, may form a pressurized airflow that directs the airflow in one direction toward the porous match plate 60, and may provide the airflow to the internal flow path 80. The bidirectional centrifugal blower 90 may be placed between the inner wall housing 110 and the outer wall housing 110, and may be placed on the upper surface of the inner wall housing 110 or may be placed to be included on the upper surface according to example embodiments.

Also, the airflow provided to the airflow input port 100 placed on the heater 50 may also be provided to the internal flow path 80 through the bidirectional centrifugal blower 90. The airflow provided to the internal flow path 80 may be transferred to the porous match plate 60.

The airflow input port 100 may be placed on the outer wall housing 120 to provide the airflow Da to the semiconductor element test device 1. In some example embodiments, to provide the airflow, liquid nitrogen (LN2) may be put into the airflow input port 100 and vaporized using the temperature of the semiconductor element test device 1 to produce a low-temperature nitrogen gas ($N_2$), and the amount of nitrogen gas ($N_2$) in the airflow Da may be increased due to input of the liquid nitrogen (LN2). The airflow Da used in the semiconductor element test device 1 may include dry air in addition to nitrogen gas ($N_2$), the dry air may include helium (He) and argon (Ar) which are stable gas, and the airflow Da is not limited to nitrogen gas (N₂).

The inner wall housing 110 and the outer wall housing 120 may be made of a stainless steel material. The inner wall housing 110 and the outer wall housing 120 may form an appearance of the semiconductor element fabricating device 1. Also, the semiconductor element fabricating device 1 may maintain a closed system, by preventing fluid from entering and exiting between the semiconductor element fabricating device 1 and the outside through the inner wall housing 110 and the outer wall housing 120 except for the airflow input port 100.

Although not shown, a heat insulation layer that inhibits (or, alternatively, prevents) heat conduction may be placed between the inner wall housing 110 and the outer wall housing 120. The heat insulation layer may include fiberglass, asbestos, styrofoam or vacuum. Furthermore, although not shown, a pipe may be placed between the inner wall housing 110 and the outer wall housing 120. The pipe may provide the airflow Da discharged through the suction port 70 to the bidirectional centrifugal blower 90.

Figure 4:
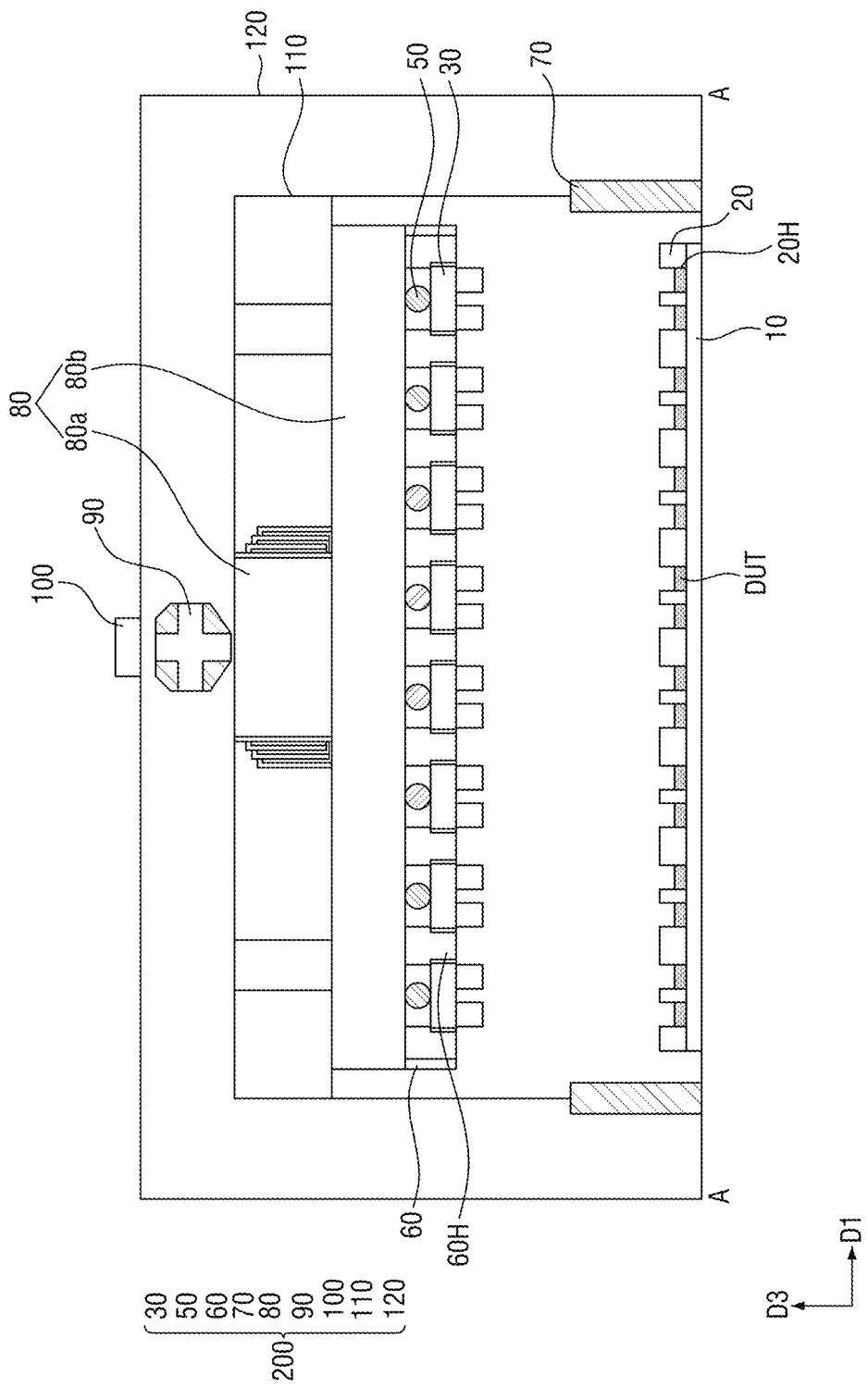
FIGS. 4 and 5 are diagrams for explaining the operation of the semiconductor element test device according to some example embodiments of the present disclosure.

FIGS. 4 and 5 are diagrams for explaining the operation of the semiconductor element test device 1 according to some example embodiments of the present disclosure. FIG. 4 is a diagram which explains the operation before the pusher 30 brings the DUT and the test board 10 into close contact with each other. When following the sequence of the load of the test board 10 and the test tray 20, the close contact between the DUT and the test board 10, and the temperature control of the DUT in the operation of the semiconductor element test device 1, FIGS. 4, 2 and 5 may be referred in order.

Referring to FIG. 4, the test tray 20 is placed on the upper surface of the test board 10, the DUT is input into the input port 20H of the test tray 20, and the test board 10, the test tray 20 and the DUT may be loaded into the test handler 200.

The length at which the plurality of flow paths included in the variable flow path 80a overlap each other may increase, compared to a state in which the porous match plate 60 ascends and the porous match plate 60 descends.

Referring to FIG. 2, the length at which the plurality of flow paths included in the variable flow path 80a overlap each other may become shorter, compared to the state in which the porous match plate 60 descends and the porous match plate 60 ascends.

The porous match plate 60 descends and at least some parts of the first and second pusher ends 30b_1 and 30b_2 are inserted into the input port 20H of the test tray 20, which makes it possible to bring the pusher 30 into close contact with the DUT and the test board 10.

Referring to FIG. 5, each of the central heater 50_1 and the outer heater 50_2 operate respectively, and the airflow Da is provided to the internal flow path 80 through the bidirectional centrifugal blower 90, and may be provided to the porous match plate 60 from the internal flow path 80.

The airflow Da may pass through the space between the central heater 50_1 and the outer heater 50_2 before the airflow Da is provided to the porous match plate 60. The airflow Da receives heat transfer by the heater 50 and the temperature thereof may be controlled accordingly. After that, the airflow Da passes through the hole 60H of the porous match plate 60, and may pass through the separated empty area V between the porous match plate 60 and the test tray 20.

The airflow Da having passed through the empty area V is sucked by the suction port 70 and discharged to the outside of the inner wall housing 110, and the discharged airflow Da may be provided to the bidirectional centrifugal blower 90 again.

Figure 7:
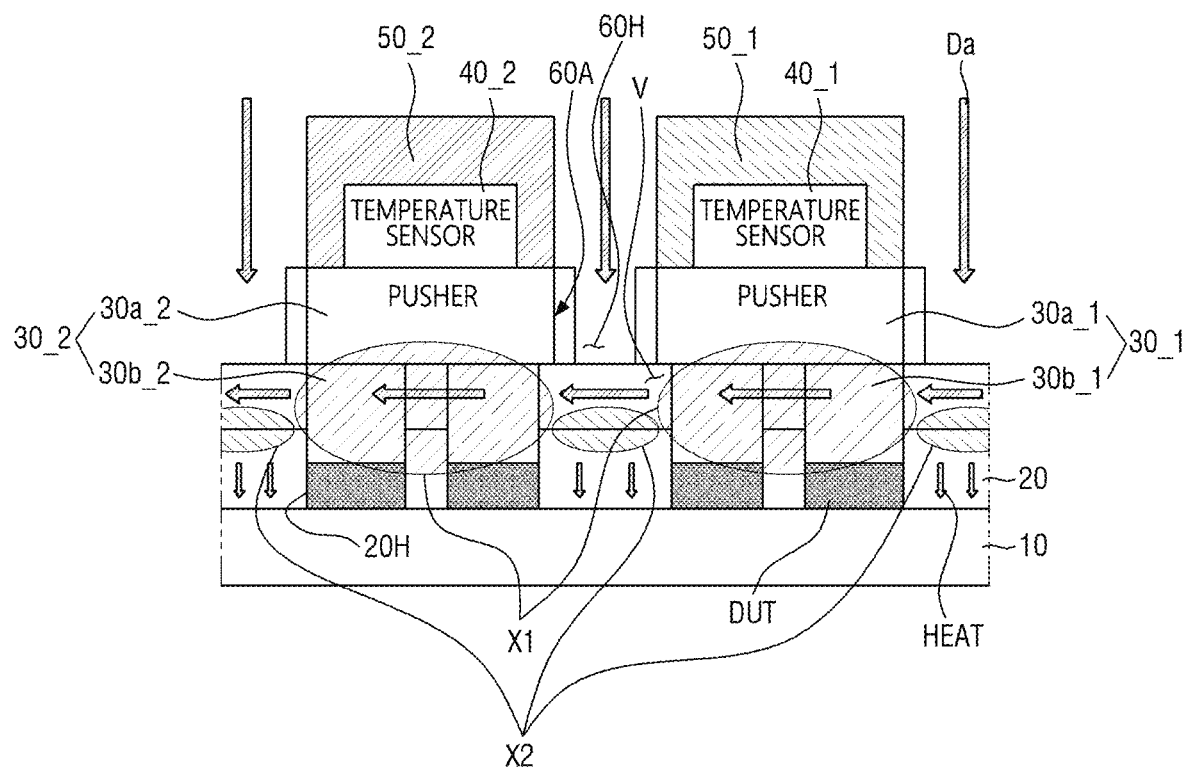
FIG. 7 is a diagram for explaining the operation of the semiconductor element test device according to some example embodiments of the present disclosure.

FIG. 6 is a diagram for explaining a temperature control of the semiconductor element test device 1 according to some example embodiments of the present disclosure. FIG. 7 is a diagram for explaining the operation of the semiconductor element test device 1 according to some example embodiments of the present disclosure. For example, FIG. 7 may explain a heat exchange in the high-temperature test.

As used herein, a high-temperature test may mean the test of the operation of the DUT in the range of 80° C. to 150° C. In the high-temperature test operation, the heaters 50 control the temperature of the airflow Da passing through the space between the heaters 50 to control the temperature of the airflow Da to be lower than the temperature of the pusher 30 and higher than the temperature of the test board 10.

The heater 50 may be placed in contact with or adjacent to the upper surface of the pusher 30 to increase the temperature of the pusher 30 through a conduction way, and the pusher 30 may also increase the temperature of the DUT through the first and second pusher ends 30b_1 and 30b_2d in the conduction way.

The airflow Da passes through the hole 60H of the porous match plate 60, and may pass through the separated empty space V between the porous match plate 60 and the test tray 20 formed by the first and second pusher ends 30b_1 and 30b_2.

Due to the temperature relationship between the test board 10, the pusher 30 and the airflow Da, in a region X1 in which the airflow Da comes into contact with the first and second pusher ends 30b_1 and 30b_2, cooling due to convection occurs on the basis of the first and second pusher ends 30b_1 and 30b_2, and in a region X2 in which the airflow Da comes into contact with the test tray 20, heating due to convection occurs on the basis of the test tray 20. The heat may be conducted from the test tray 20 to the test board 10.

Therefore, the first and second pusher ends 30b_1 and 30b_2 which come into contact with the upper surface of the DUT may control the temperature of the upper part of the DUT in the partially cooled state in the conduction way. The test board 10 and the test tray 20 which come into contact with the lower part of the DUT may control the temperature of the lower part of the DUT in the partially heated state in the conduction way.

The temperature sensor 40 receives heat transfer of the pusher 30 in the conduction way, may measure the temperature of the pusher 30, and may send a signal to the measured temperature information to the temperature controller 400.

The temperature controller 400 may control the heater 50 again on the basis of the received temperature information.

Figure 8:
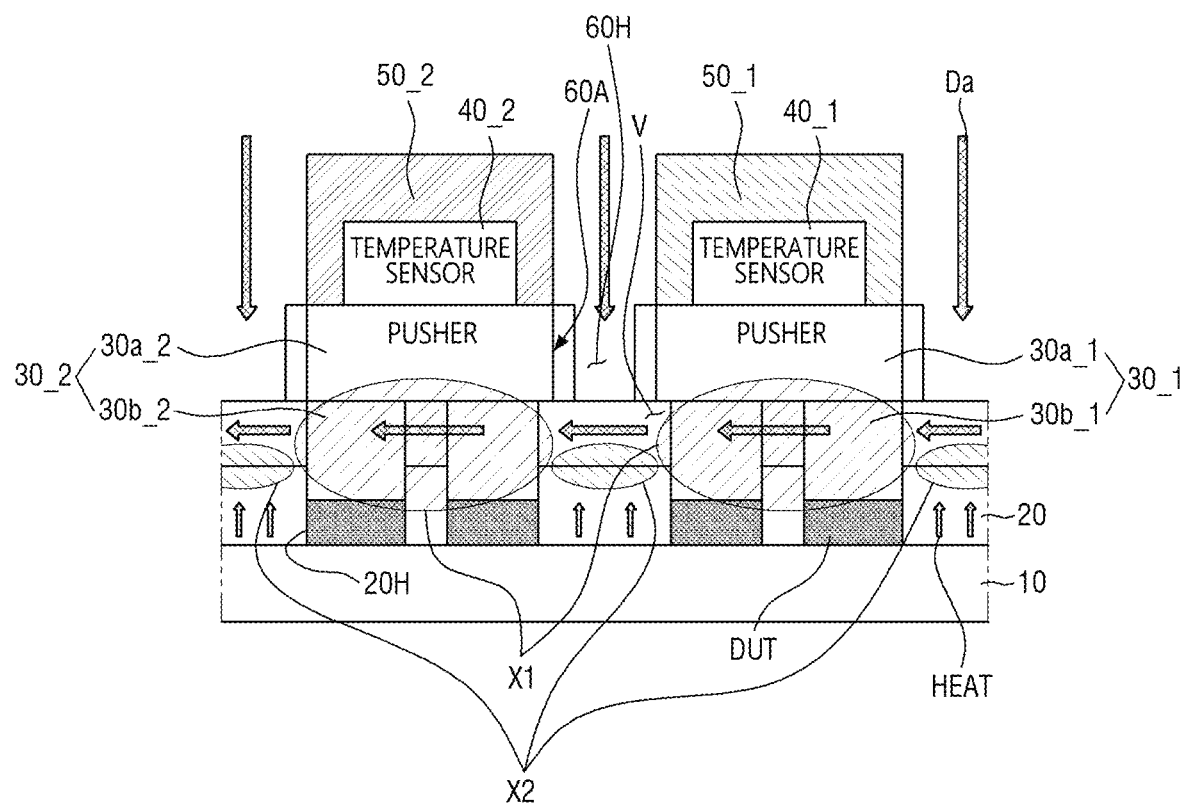
FIG. 8 is a diagram for explaining the operation of the semiconductor element test device according to some example embodiments of the present disclosure.

FIG. 8 is a diagram for explaining the operation of the semiconductor element test device 1 according to some example embodiments of the present disclosure. For example, FIG. 8 may explain a heat exchange in a low-temperature test.

Referring to FIGS. 6 and 8, in the present application, the low-temperature test may mean the test of the operation of the DUT in the range of −40° C. to −15° C. According to example embodiments, in the aforementioned low-temperature test operation, liquid nitrogen (LN2) may be put into the airflow input port 100, and the put liquid nitrogen is vaporized to gas due to the temperature inside the test handler 200 and may be contained in the airflow Da. The temperature of the airflow Da formed in this way may be lower than the temperature of the pusher 30 and the temperature of the test board 10. Therefore, it is possible to increase the amount of nitrogen gas ($N_2$) in the airflow Da by inputting liquid nitrogen into the airflow input port 100 for continuous low-temperature test according to example embodiments.

In addition to the aforementioned temperature control way of the airflow Da, in the low-temperature test operation, the heaters 50 may control the temperature of the airflow Da passing through the space between the heaters 50, and may control the temperature of the airflow Da to be lower than the temperature of the pusher 30 and the temperature of the test board.

The heater 50 may be placed in contact with or adjacent to the upper surface of the pusher 30 to increase the temperature of the pusher 30 through the conduction way, and the pusher 30 may also increase the temperature of the DUT through the first and second pusher ends 30b_1 and 30b_2 in the conduction way.

The airflow Da passes through the hole 60H of the porous match plate 60 and may pass through the separated empty space V between the porous match plate 60 and the test tray 20 formed by the first and second pusher ends 30b_1 and 30b_2.

Due to the temperature relationship between test board 10, the pusher 30 and the airflow Da, in the region X1 in which the airflow Da comes into contact with the first and second pusher ends 30b_1 and 30b_2, cooling due to convection occurs on the basis of the first and second pusher ends 30b_1 and 30b_2, and in the region X2 in which the airflow Da comes into contact with the test tray 20, cooling occurs due to convection on the basis of the test tray 20. Heat may be conducted from the test board 10 to the test tray 20.

Therefore, the first and second pusher ends 30b_1 and 30b_2 which come into contact with the upper surface of the DUT may control the temperature of the upper part of the DUT in the partially cooled state in the conduction way. The test board 10 and the test tray 20, which come into contact with the lower part of the DUT, may control the temperature of the lower part of the DUT in the partially cooled state in the conduction way.

The temperature sensor 40 receives heat transfer of the pusher 30 in the conduction manner, may measure the temperature of the pusher 30, and may send a signal about the measured temperature information to the temperature controller 400.

The temperature controller 400 may control the heater 50 again on the basis of the received temperature information.

Figure 9:
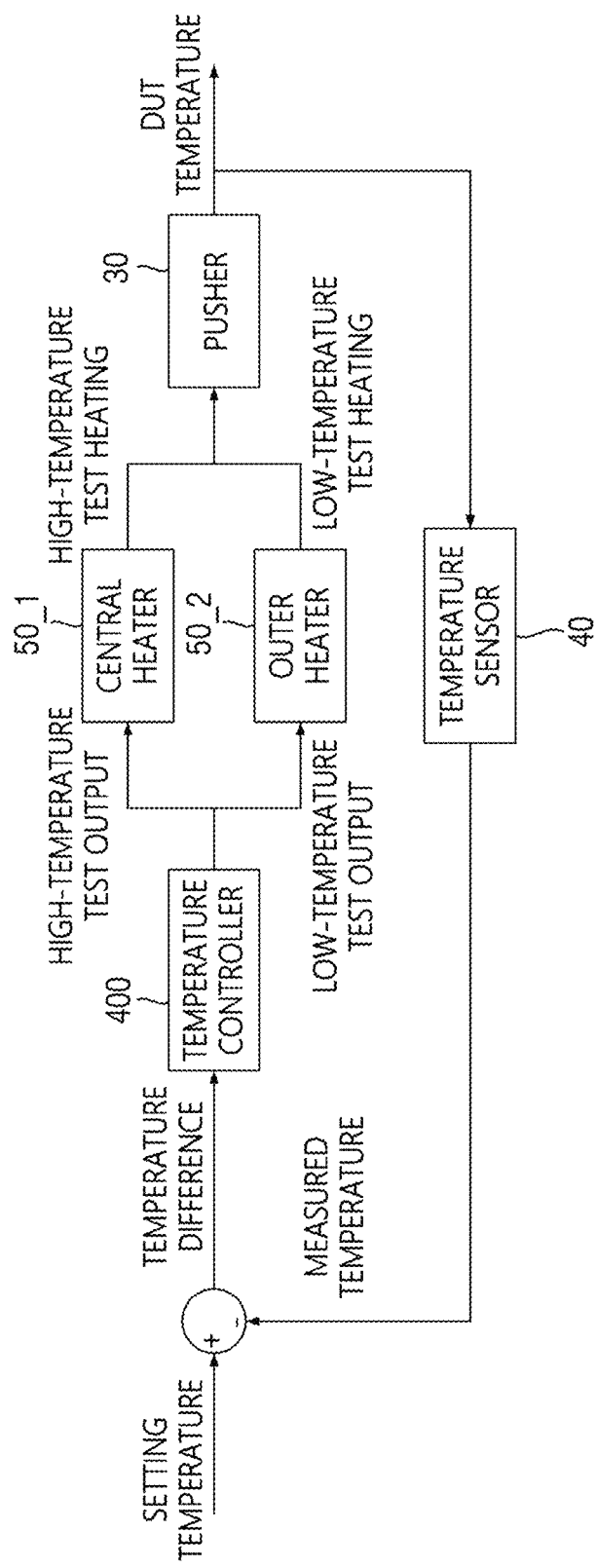
FIG. 9 is a diagram for explaining the temperature control of the semiconductor element test device according to some example embodiments of the present disclosure.
Figure 10:
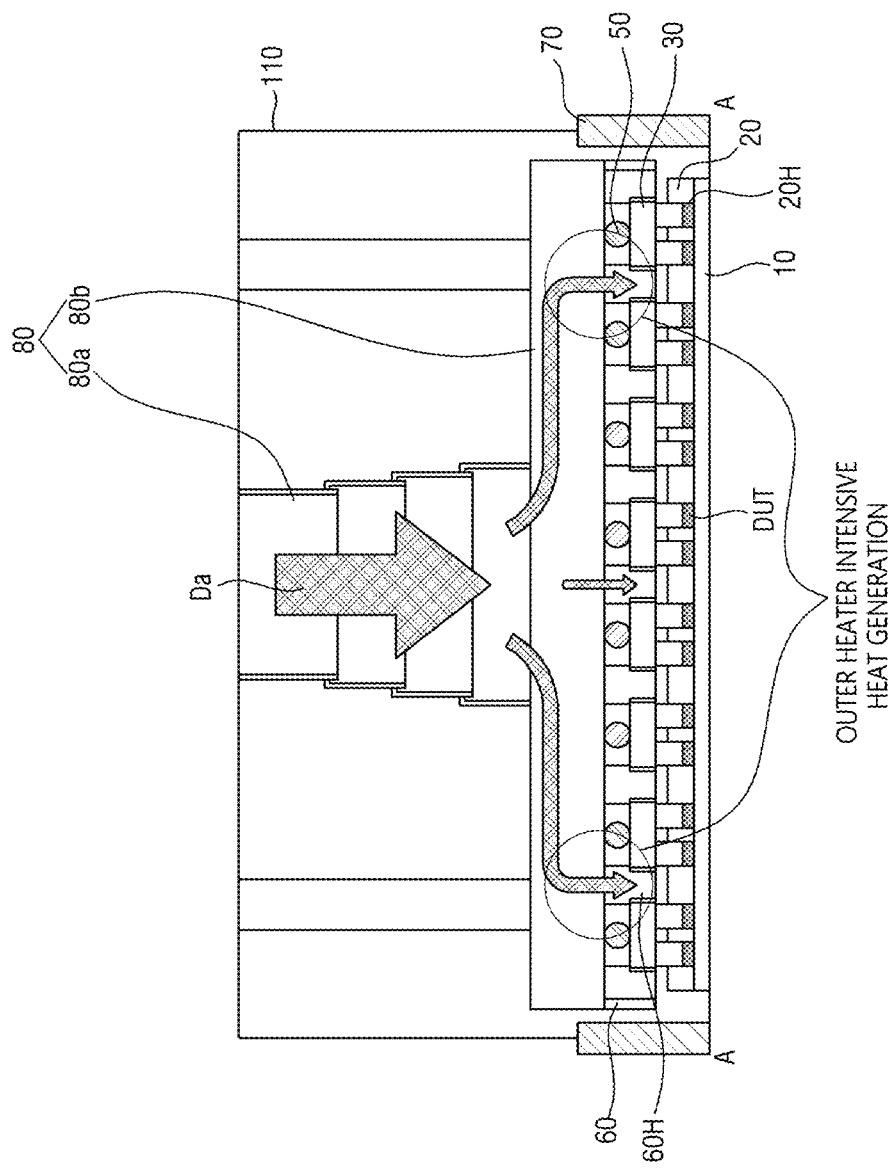
FIG. 10 is a diagram for explaining the operation of the semiconductor element test device according to some example embodiments of the present disclosure.

FIG. 9 is a diagram for explaining a temperature control of the semiconductor element test device 1 according to some example embodiments of the present disclosure. FIG. 10 is a diagram for explaining the operation of the semiconductor element test device 1 according to some example embodiments of the present disclosure. FIG. 10 is a diagram for explaining the operation of the central heater 50_1 and the outer heater 50_2 in the high-temperature test.

Referring to FIGS. 9 and 10, in the case of the high-temperature test, the temperature of the airflow Da may be controlled to be higher than the temperature of the test board 10 as described in FIG. 7 above.

As for the velocity of the airflow Da, a flow velocity in the outer region PR may be faster than a flow velocity in the central region CR by suction of the suction port 70. Therefore, an amount of airflow Da coming into contact with the test tray 20 in the outer region PR may be greater than an amount of airflow Da coming into contact with the test tray 20 in the central region CR for the same time period.

Therefore, because a heat exchange due to convection between the test tray 20 and the airflow Da is more active in the outer region PR than in the central region CR, and the DUT is heated more actively in the outer region PR, the measured temperature of DUT in the outer region PR may be higher than the measured temperature of DUT in the central region CR.

The temperature controller 400 may receive information about the temperature difference between the plurality of DUTs from the plurality of temperature sensors 40 and control the central heater 50_1 and outer heater 50_2 to be appropriate for the high-temperature test. The central heater 50_1 may more intensively generate heat than the outer heater 50_2 in a compensation manner to supply more heat to the first pusher 30_1 and control the temperature difference between the plurality of DUTs. That is, the central heater 50_1 and the outer heater 50_2 may be controlled independently to control the temperature difference between the plurality of DUTs.

Figure 11:
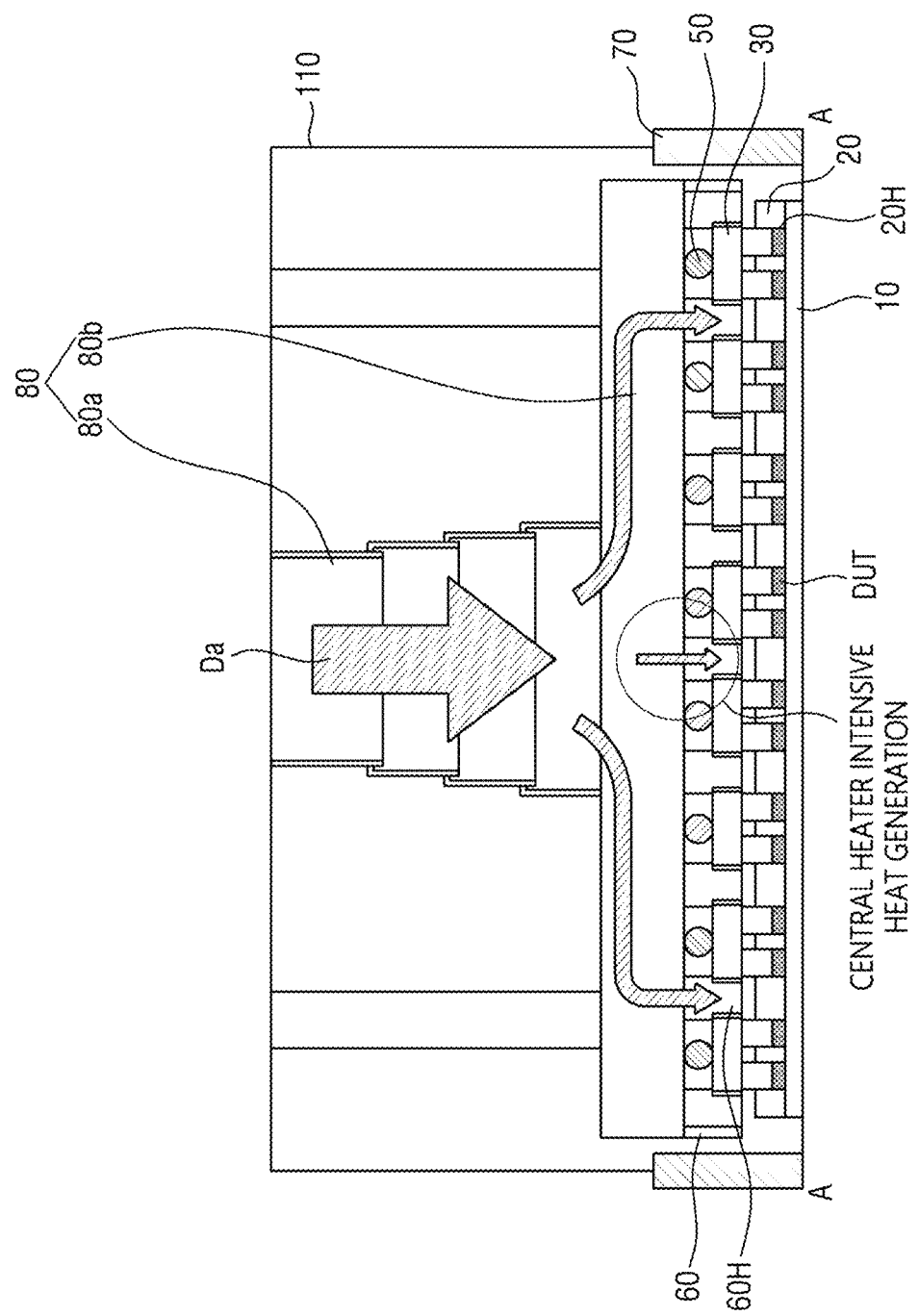
FIG. 11 is a diagram for explaining the operation of the semiconductor element test device according to some example embodiments of the present disclosure.

FIG. 11 is a diagram for explaining the operation of the semiconductor element test device 1 according to some example embodiments of the present disclosure. FIG. 11 is a diagram for explaining the operation of the central heater 50_1 and the outer heater 50_2 in the low-temperature test.

In the case of the low-temperature test, the temperature of the airflow Da may be controlled to be lower than the temperature of the test board 10 as explained in FIG. 8 above.

As for the velocity of the airflow Da, the flow velocity in the outer region PR may be faster than the flow velocity in the central region CR by suction of the suction port 70. Therefore, the amount of airflow Da coming into contact with the test tray 20 in the outer region PR may be greater than the amount of airflow Da coming into contact with the test tray 20 in the central region CR for the same time period.

Therefore, because a heat exchange due to convection between the test tray 20 and the airflow Da is more active in the outer region PR than in the central region CR, and the DUT is more actively cooled in the outer region PR, the measured temperature of DUT in the outer region PR may be lower than the measured temperature of DUT in the central region CR.

The temperature controller 400 may receive information about the temperature difference between the plurality of DUTs from the plurality of temperature sensors 40 and control the central heater 50_1 and outer heater 50_2 to be appropriate for a low-temperature test. The outer heater 50_2 may more intensively generate heat than the central heater 50_1 in the compensation manner to supply more heat to the second pusher 30_2, and control the temperature difference between the plurality of DUTs. That is, the central heater 50_1 and the outer heater 50_2 may be controlled independently to control the temperature difference between the plurality of DUTs.

In FIGS. 9 to 11, that is, although only the central heater 50_1 and the outer heater 50_2 are controlled dividedly and independently to control the temperature difference between the plurality of DUTs, the number of types of the heater 50 is not limited to two in the operation of the present disclosure, and the heater 50 that operates separately unlike FIGS. 9 to 11 through feedback of the temperature sensor 40 and the temperature controller 400 may be included. For example, even if the heater is placed on the central region CR of the test tray 20, it may operate like the outer heater 50_2 of FIGS. 9 to 11.

Figure 12:
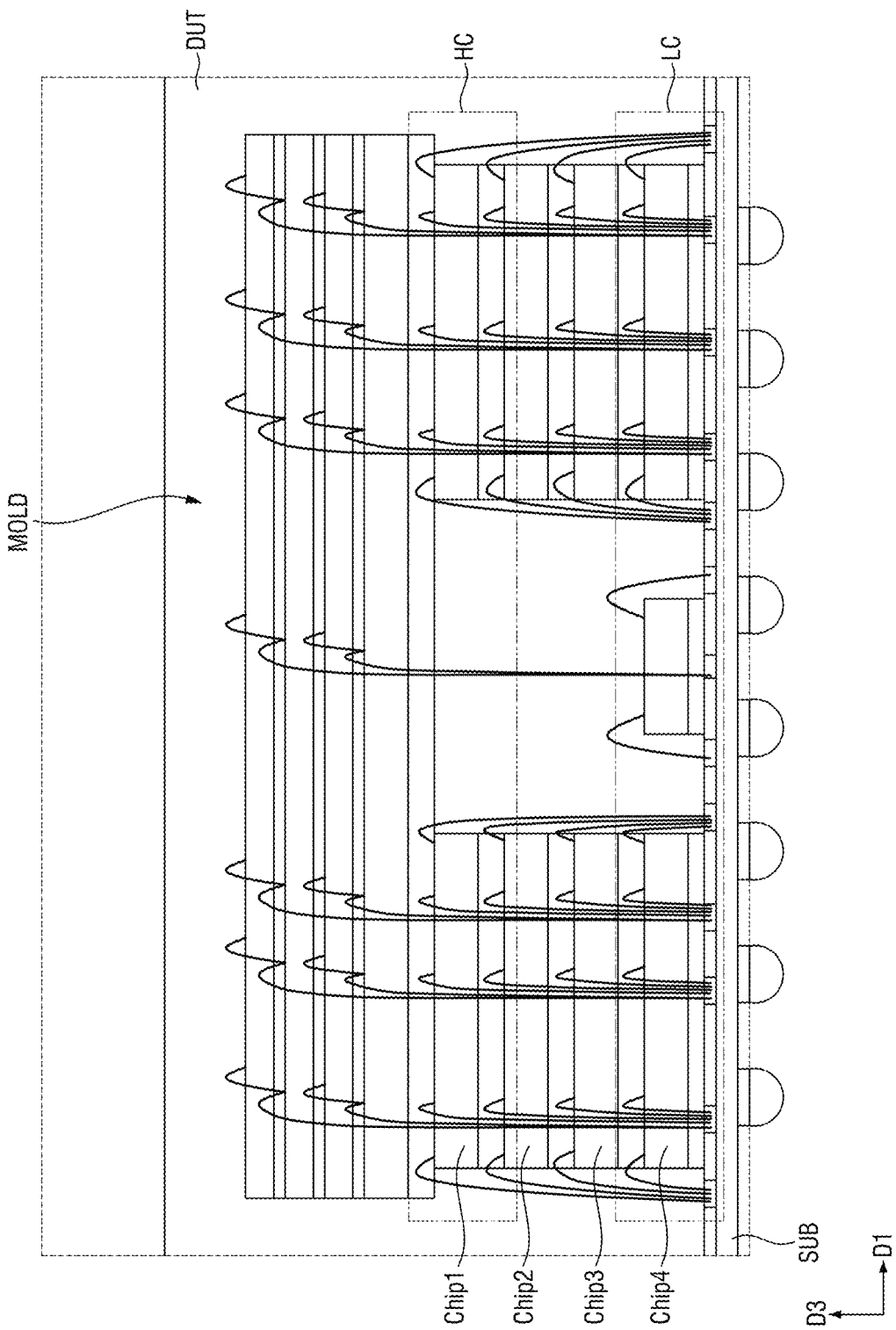
FIGS. 12 to 14 are diagrams for explaining the effect of the semiconductor element test device according to some example embodiments of the present disclosure.
Figure 13:
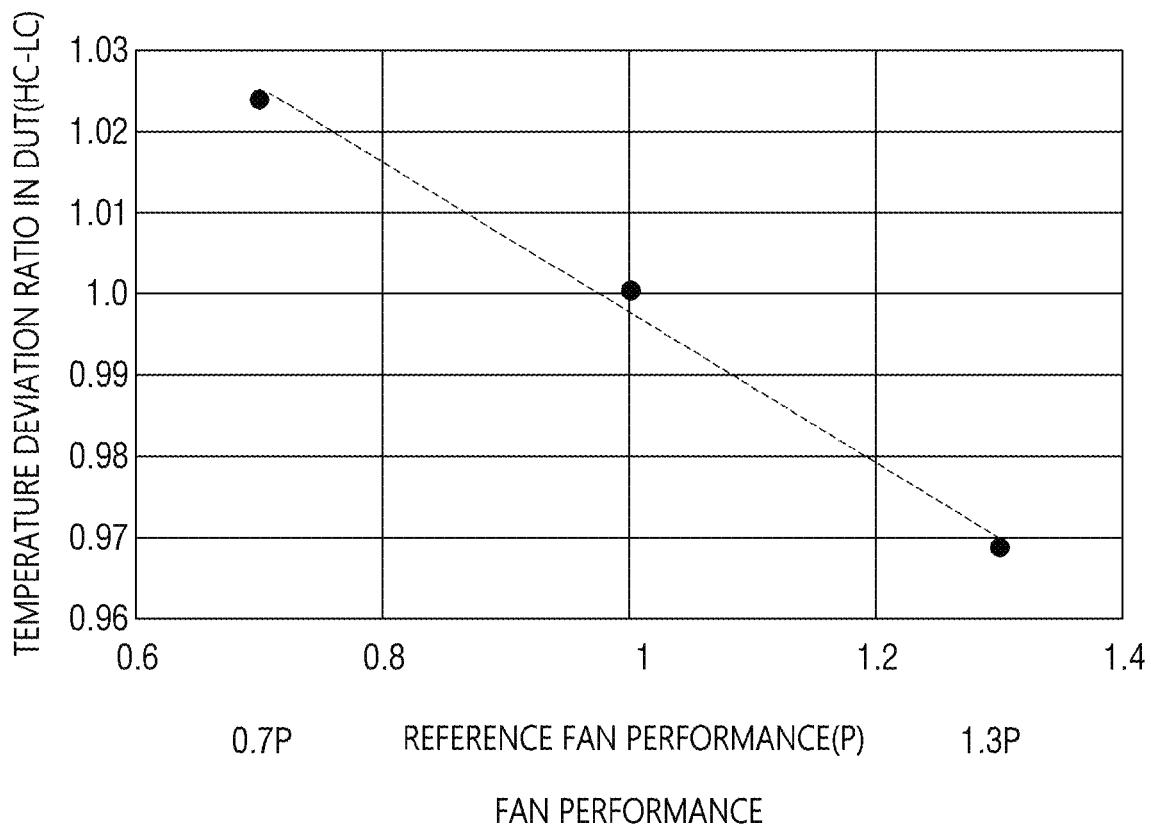
Figure 14:
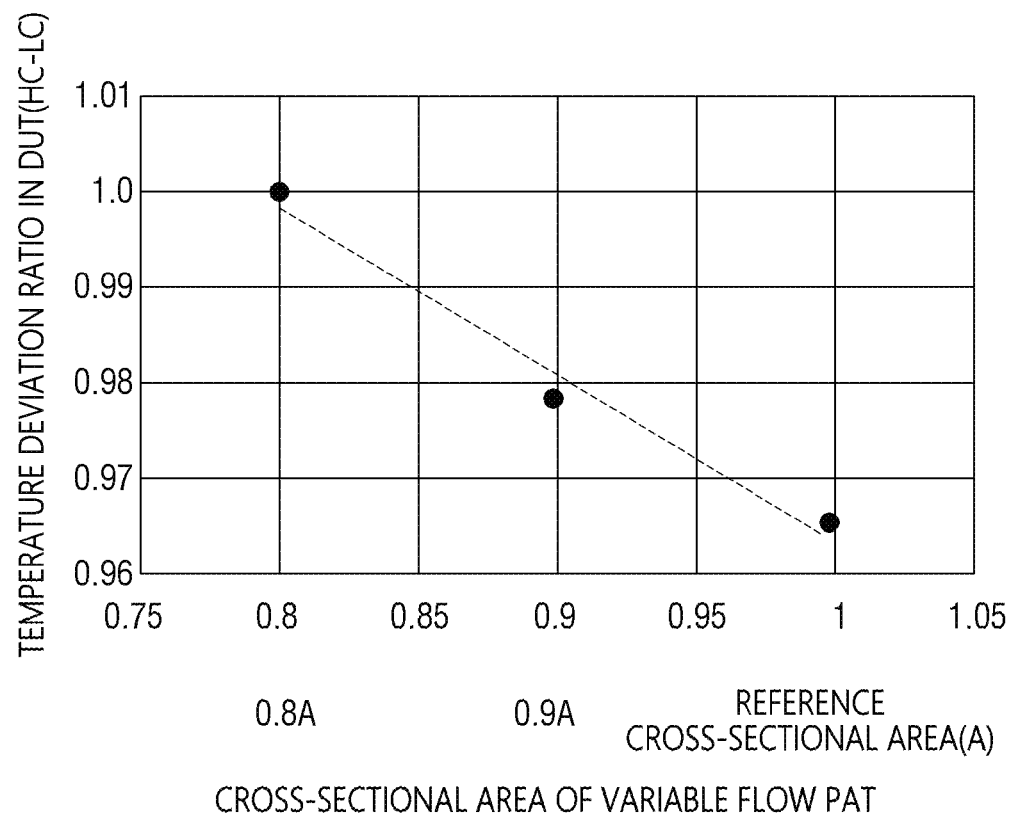

FIGS. 12 to 14 are diagrams for explaining the effect of the semiconductor element test device 1 according to some example embodiments of the present disclosure. FIG. 12 is a cross-sectional view which explains the structure of the DUT.

Referring to FIGS. 12 to 14, the DUT may be a semiconductor element having a package structure, a package substrate SUB may be placed below the DUT, and the DUT may include a structure in which a plurality of semiconductor chips Chip1 and Chip4 is stacked in a third direction D3.

The plurality of semiconductor chips Chip1 to Chip4 may be, for example, a memory chip. For example, the memory chip may be a volatile memory chip such as a DRAM (Dynamic Random Access Memory) or a SRAM (Static Random Access Memory), or a non-volatile memory chip such as a PRAM (Phase-change Random Access Memory), a MRAM (Magnetoresistive Random Access Memory), a FeRAM (Ferroelectric Random Access Memory), a RRAM (Resistive Random Access Memory), and a VNAND (Vertical NAND). Further, the memory chip may be an HBM (High Bandwidth Memory) memory chip in which a plurality of DRAM memory chips is stacked. The aforementioned examples are merely examples of the semiconductor chip, and example embodiments are not limited to the aforementioned examples.

Although four semiconductor chips are shown in the drawings, the number of semiconductor chips stacked on the shown device under test DUT does not limit the example embodiments. However, a first semiconductor chip Chip 1 placed at the top on the basis of the third direction D3 may be specified as a highest chip HC, and a fourth semiconductor chip Chip 4 placed at the bottom on the basis of the third direction D3 may be specified as a lowest chip LC.

A mold layer MOLD may be formed between a plurality of semiconductor chips Chip1 and Chip4 on the package substrate SUB. The upper surface of the DUT may coincide with the upper surface of the mold layer MOLD. Although the mold layer MOLD may be an electrically insulating material, it may be a material capable of performing heat conduction rather than heat insulation, and as an example, it may be a silicon oxide, but is not limited thereto.

FIG. 13 shows a temperature deviation ratio between the highest chip HC and the lowest chip LC in the DUT according to the fan performance P in the bidirectional centrifugal blower 90 that supplies the airflow Da. Referring to FIG. 13, it is possible to know that as the fan performance becomes higher than the reference fan performance P, the temperature deviation ratio between the highest chip HC and the lowest chip LC decreases, and as the fan performance becomes lower than the reference fan performance P is, the temperature deviation ratio between the highest chip HC and the lowest chip LC increases.

It is possible to know that as the fan performance increases, an amount of airflow Da passing through the empty space V separated between the test tray 20 and the porous match plate 60 increases, and as the passing amount of airflow Da increases, the heat exchange between the airflow Da passing through the empty space V and the test tray 20 and the first and second pusher ends 30b_1 and 30b_2 is activated, and the temperature deviation ratio between the highest chip HC and the lowest chip LC decreases.

Therefore, it is possible to provide a semiconductor element test device 1 that causes the airflow Da to pass between the holes 60H in the porous match plate 60 to control the test temperature, while reducing the temperature difference inside the semiconductor element.

FIG. 14 shows the temperature deviation ratio between the highest chip HC and the lowest chip LC in the DUT according to the area of the hole 60H in the porous match plate 60. Referring to FIG. 13, it is possible to know that as the area of the hole 60H increases from the reference area A, the temperature deviation ratio between the highest chip HC and the lowest chip LC decreases, and as the area of the hole 60H decreases from the reference area A, the temperature deviation ratio between the highest chip HC and the lowest chip LC increases.

It is possible to know that as the area of the holes 60H increases, the amount of airflow Da passing through the separated empty space V between the test tray 20 and the porous match plate 60 through the holes 60H of the porous match plate 60 increases, and as the amount of passing airflow Da increases, the heat exchange between the airflow Da passing through the empty space V, the test tray 20, the first and second pusher ends 30b_1 and 30b_2 is activated, and the temperature deviation ratio between the highest chip HC and the lowest chip LC decreases.

Therefore, it is possible to provide the semiconductor element test device 1 that causes the airflow Da to pass between the holes 60H in the porous match plate 60 to control the test temperature, while reducing the temperature difference inside the semiconductor device.

Figure 15:
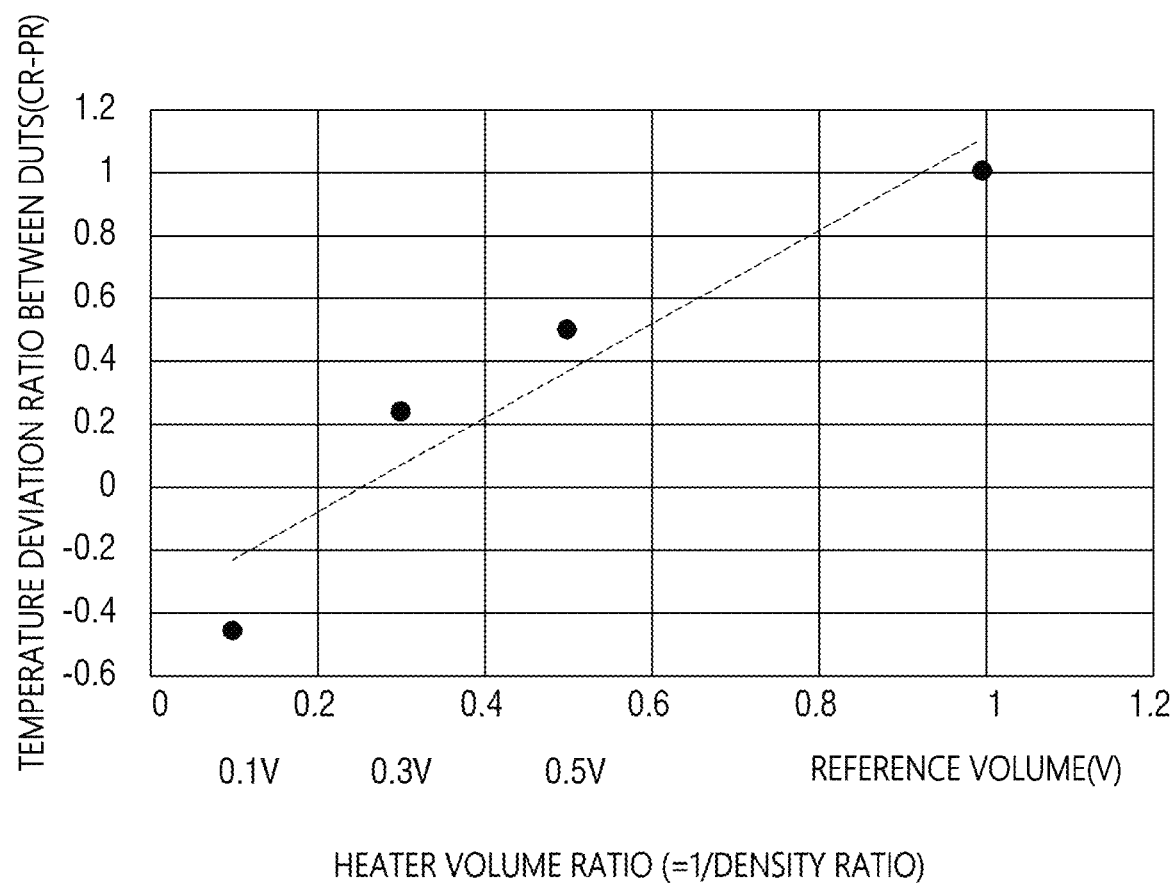
FIGS. 15 to 16 are diagrams for explaining the effect of the semiconductor element test device according to some example embodiments of the present disclosure.
Figure 16:
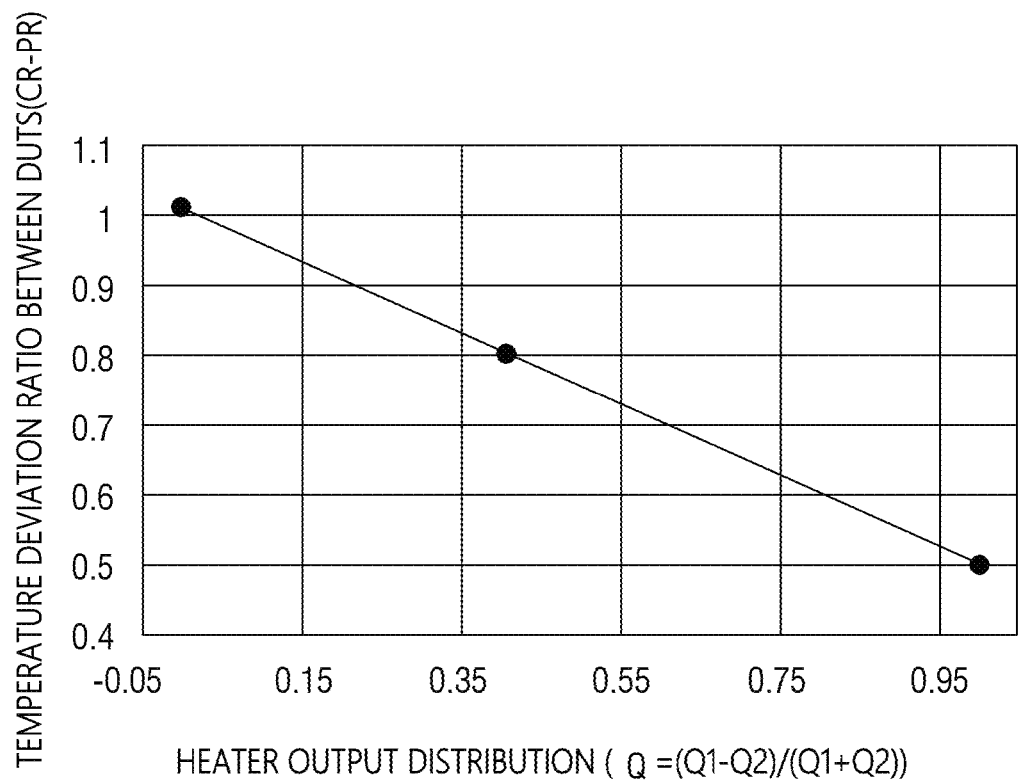

FIGS. 15 to 16 are diagrams for explaining the effect of the semiconductor element test device 1 according to some example embodiments of the present disclosure.

FIG. 15 shows the temperature deviation ratio between the DUT placed in the central region CR and the DUT placed in the outer region PR according to a volume ratio of the heater 50 (assuming a high-temperature test). Referring to FIG. 15, it is possible to know that, when the volume ratio of the heater 50 becomes smaller than the reference volume V, the temperature deviation ratio between the DUT placed in the central region CR and the DUT placed in the outer region PR decreases.

As the volume ratio of the heater 50 increases, the area of the heater that operates equally from a planar viewpoint becomes wide. That is, as the heater volume ratio increases, the structure becomes difficult to operate the heater independently, and when assuming a high-temperature test, heat is intensively generated at the center.

As the ratio of the heater 50 operating equally decreases, that is, as the heater operates independently for each region, the temperature deviation ratio between the DUT placed in the central region CR and the DUT placed in the outer region PR decreases. Therefore, it is possible to provide a semiconductor element test device 1 that causes the heater 50 to operate independently for each region to control the test temperature, while reducing the temperature difference between the semiconductor elements.

FIG. 16 shows the temperature deviation ratio between the DUT placed in the central region CR and the DUT placed in the outer region PR according to the output distribution Q of the heater.

The output distribution Q of the heater 50 is as in the following Equation 1.

$$Q = \frac{Q1 - Q2}{Q1 + Q2} \qquad \text{Equation 1}$$

In the aforementioned equation 1, Q1 means an output amount at a point on which the temperature needs to increase, and Q2 means an output amount at a point on which the temperature needs to increase.

For example, the output amount which is output from the central heater 50_1 may be set as Q1, and the output amount which is output from the outer heater 50_2 may be set as Q2 at the time of the high-temperature test of FIG. 10. Therefore, when heat is intensively generated in the central heater 50_1 at the time of the high-temperature test, the output distribution Q of the heater 50 becomes a positive number exceeding 0, and when heat is intensively generated in the central heater 50_1 at the time of the high-temperature test, the output distribution Q of the heater 50 may become a negative number less than 0. Therefore, when the central heater 50_1 and the outer heater 50_2 operate according to FIGS. 9 to 11, the temperature deviation ratio between the DUT placed in the central region CR and the DUT placed in the outer region PR decreases. Therefore, it is possible to provide a semiconductor element test device 1 which causes the heater 50 to efficiently operate to control the test temperature, while reducing the temperature difference between the semiconductor elements.

Figure 17:
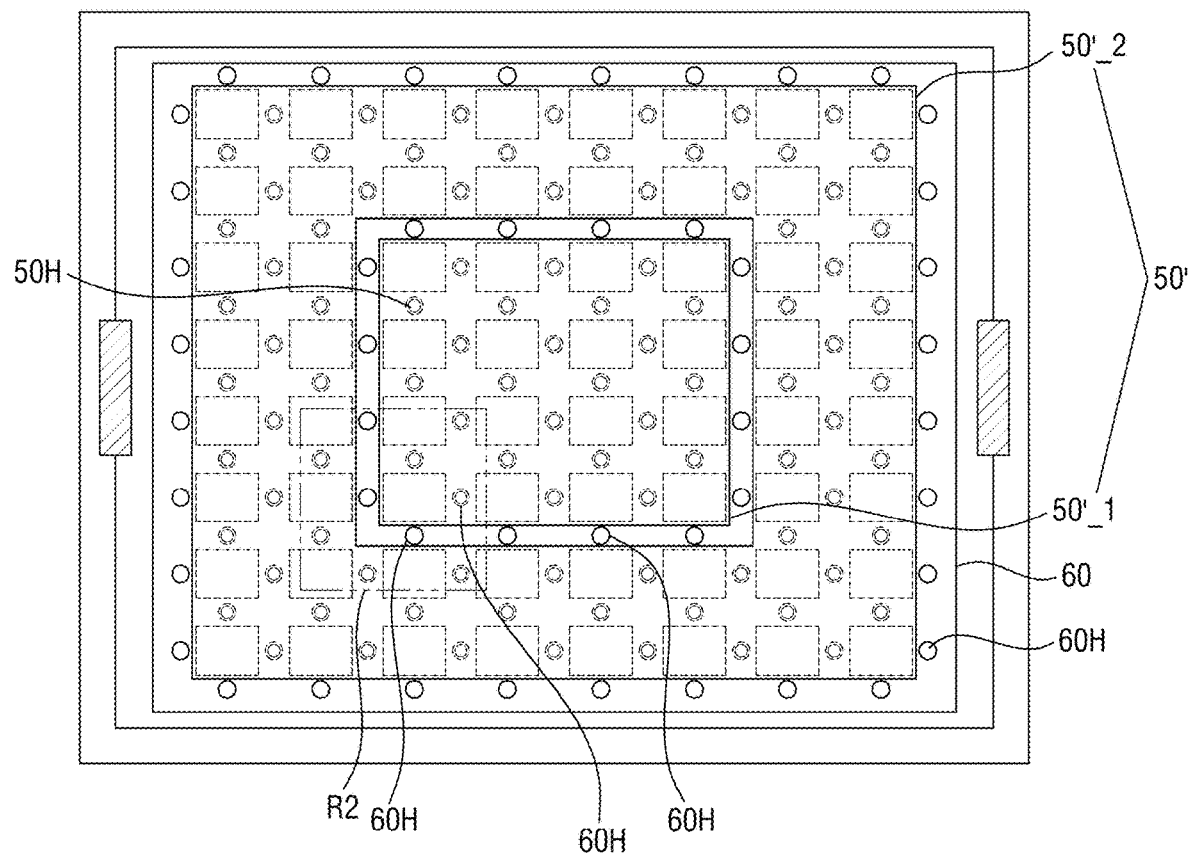
FIG. 17 is a plan view for explaining the semiconductor element test device according to some other example embodiments of the present disclosure.
Figure 18:
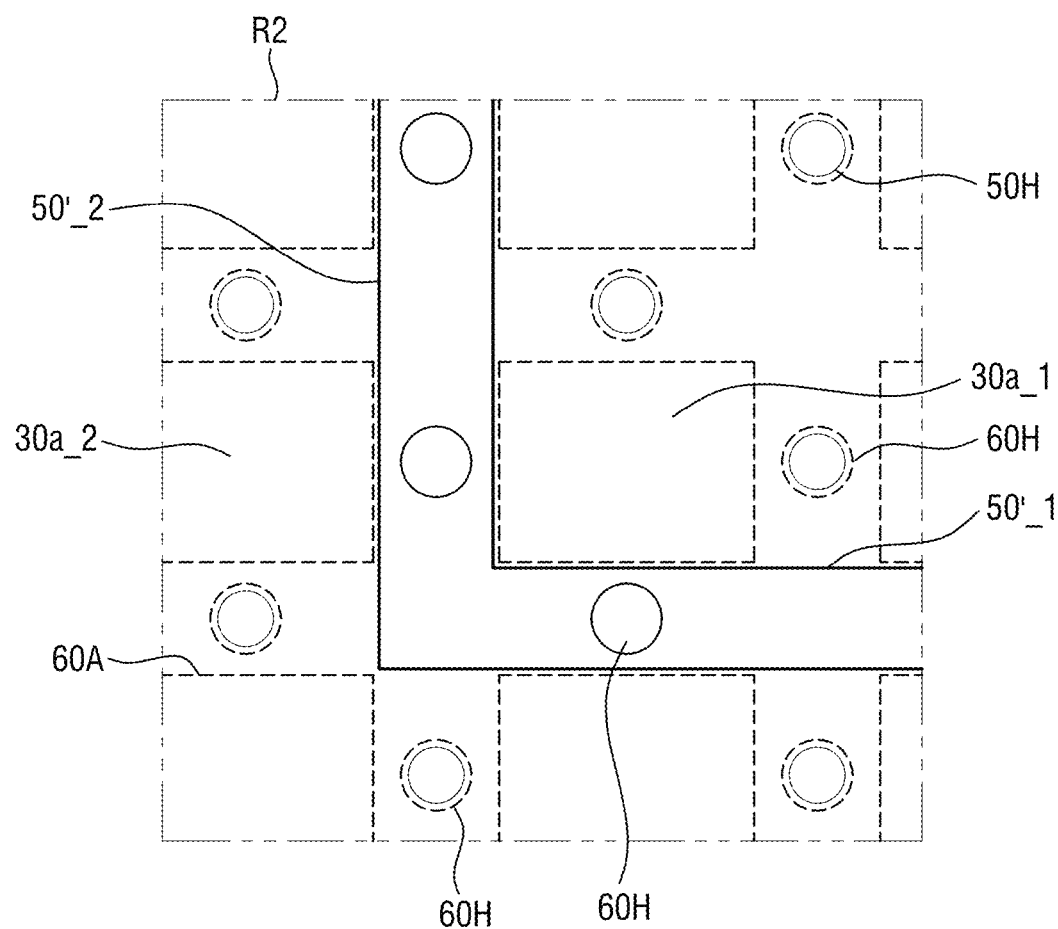
FIG. 18 is an enlarged view of a region R2 of FIG. 17.

FIG. 17 is a plan view for explaining a semiconductor element test device 2 according to some other example embodiments of the present disclosure. FIG. 18 is an enlarged view of a region R2 of FIG. 17. Differences from the semiconductor element test device 1 of FIGS. 1 to 3 will be mainly described.

In the semiconductor element test device 1 of FIGS. 1 to 3, the heaters 50 are placed apart from each other to correspond to the number of pushers 30, and there may be a plurality of central heaters 50_1 placed in the central region CR.

However, one central heater 50'_1 is placed in the central region CR, and one outer heater 50'_2 may be placed in the outer region PR in the heater 50 of the semiconductor element test device 2 shown in FIGS. 17 and 18.

However, the central heater 50'_1 and the outer heater 50'_2 are not separated and spaced into the plurality of heaters, but heater holes 50H that at least partially overlap the holes 60H of the porous match plate 60 are included. The temperature of the airflow may be controlled by the heater 50, while the airflow passes through the heater hole 50H, and the airflow passing through the heater hole 50H may continuously pass through the hole 60H of the porous match plate 60. An area comparison between the heater hole 50H and the hole 60H of the porous match plate 60 may be different depending on example embodiments, and the aforementioned area comparison does not limit the example embodiments.

Furthermore, a separated space is formed between the central heater 50'_1 and the outer heater 50'_2, and the temperature of the airflow may be controlled by the heater 50 while the airflow passes through the space. The airflow having passed through the space may continuously pass through the hole 60H of the porous match plate 60.

Figure 19:
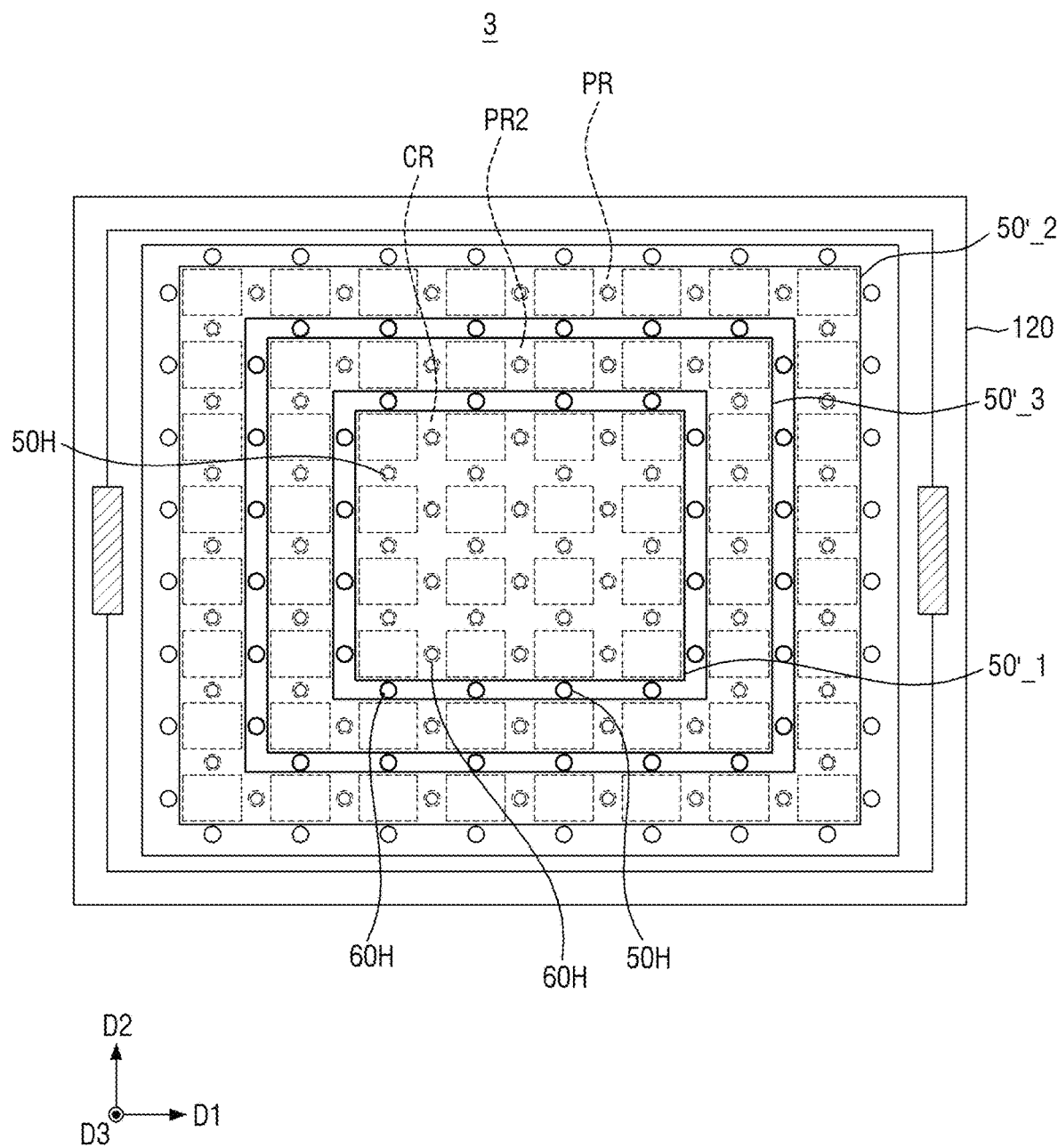
FIG. 19 is a plan view for explaining a semiconductor element test device according to some other example embodiments of the present disclosure.

FIG. 19 is a plan view for explaining a semiconductor element test device according to some other example embodiments of the present disclosure. Differences from the semiconductor element test device 3 shown in FIGS. 17 and 18 will be mainly described.

When compared with the semiconductor element test device 2 of FIGS. 17 and 18, the test tray 20 in the semiconductor element test device 3 of FIG. 19 may further include a second outer region PR2 between the central region CR and the outer region PR.

As for the heater 50, the central heater 50'_1 may be placed on the central region CR, the outer heater 50'_2 may be placed on the outer region PR, and a second outer heater 50'_3 may be placed on the second outer region PR2.

The second outer heater 50'_3 also includes a heater hole 50H that at least partially overlaps the hole 60H of the porous match plate 60, and the temperature of the airflow may be controlled by the heater 50, while the airflow passes through the heater hole 50H. The airflow having passed through the heater hole 50H may continuously pass through the hole 60H of the porous match plate 60.

However, the effects of example embodiments are not restricted to the one set forth herein. The above and other effects of example embodiments will become more apparent to one of daily skill in the art to which the present disclosure pertains by referencing the claims.

What is claimed is:

1. A test handler comprising:
    a pusher including a pusher end and a pusher body, the pusher end separating a test tray for fixing a Device Under Test (DUT) and the pusher body from each other, the pusher end configured to come into contact with the DUT to transfer heat, and the pusher body configured to conduct heat to the pusher end;
    a porous match plate having the pusher body on a pusher arrangement region thereof with a plurality of holes adjacent to the pusher arrangement region;
    a heater on an upper surface of the porous match plate, the heater configured to control a temperature of the pusher; and
    an airflow input port on the heater, the airflow input port configured to provide an airflow to the plurality of holes such that the airflow passes through the plurality of holes and through a separated space between the test tray and the pusher body.

2. The test handler of claim 1, wherein
    the DUT includes a first DUT in a central region of the test tray, and a second DUT in an outer region of the test tray,
    the pusher includes a first pusher on the first DUT, and a second pusher on the second DUT such that the second pusher is spaced apart from the first pusher, and
    the heater includes a central heater on the first pusher, and an outer heater on the second pusher.

3. The test handler of claim 2, wherein the central heater and the outer heater are independently operable to independently control the temperature of the first pusher and the temperature of the second pusher.

4. The test handler of claim 3, wherein the central heater and the outer heater are independently operable such that an amount of heat supplied by the central heater is greater than an amount of heat supplied by the outer heater, in response to a desired temperature of a test operation on the DUT being within a range of 80° C. to 150° C.

5. The test handler of claim 3, wherein the central heater and the outer heater are independently operable such that an amount of heat supplied by the outer heater is greater than an amount of heat supplied by the central heater, in response to a desired temperature of a test operation on the DUT being within a range of −40° C. to −15° C.

6. The test handler of claim 1, wherein the airflow input port is configured to supply the airflow having an air temperature lower than the temperature of the pusher and the temperature of the test tray such that the airflow cools the pusher end and the test tray.

7. The test handler of claim 6, wherein the airflow input port is configured to receive a liquefied nitrogen to increase an amount of nitrogen gas in the airflow, in response to a desired temperature of a test operation on the DUT being within a range of −40° C. to −15° C.

8. The test handler of claim 1, wherein the heater includes heater holes at least partially overlapping with the plurality of holes from a planar viewpoint and through which the airflow passes such that an air temperature of the airflow is controlled by the heater, while the airflow passes through the heater holes.

9. A test handler comprising:
a plurality of pushers configured to comes into contact with a plurality of Devices Under Test (DUTs) to transfer heat, the plurality of pushers including a first pusher and a second pusher, the first pusher on a central region of a test tray and the second pusher on an outer region of the test tray;
a porous match plate having the plurality of pushers on respective ones of a plurality of pusher arrangement regions thereof with a plurality of holes placed between respective ones of the plurality of pusher arrangement regions;
a heater including a central heater on the first pusher and an outer heater on the second pusher; and
an airflow input port on the heater, the airflow input port configured to provide the airflow to the plurality of holes such that the airflow passes through a space between the central heater and the outer heater and through the plurality of holes to control temperatures of the plurality of pushers.

10. The test handler of claim 9, wherein
the plurality of DUTs includes a first DUT below the first pusher and a second DUT below the second pusher,
the central heater and the outer heater are independently operable to independently control the temperatures of the first pusher and the second pusher.

11. The test handler of claim 10, further comprising:
a first temperature sensor configured to detect a first temperature of the first pusher, and
a second temperature sensor configured to detect a second temperature of the second pusher, wherein
the central heater is controlled based on the first temperature and the outer heater is controlled based on the second temperature.

12. The test handler of claim 10, wherein the central heater and the outer heater are independently operable such that an amount of heat supplied by the central heater is greater than an amount of heat supplied by the outer heater, in response to a desired temperature of a test operation on the DUT being within the range of 80° C. to 150° C.

13. The test handler of claim 10, wherein the central heater and the outer heater are independently operable such that an amount of heat supplied by the outer heater is greater than amount of heat supplied by the central heater, in response to a desired temperature of a test operation on the DUT being within the range of −40° C. to −15° C.

14. The test handler of claim 9, wherein
the first pusher includes a first pusher end and a first pusher body, the first pusher end configured to come into contact with at least one of the plurality of DUTs to transfer heat, and the first pusher body configured to conduct heat to the first pusher end,
the second pusher includes a second pusher end and a second pusher body, the second pusher end configured to come into contact with at least one of the plurality of DUTs to transfer heat, and the second pusher body configured to conduct heat to the second pusher end, and
the first pusher end and the second pusher end separate the test tray from the porous match plate.

15. The test handler of claim 14, wherein the airflow passes through the plurality of holes and through a separated space between the test tray and the porous match plate to control the temperatures at the first pusher end and the second pusher end.

16. A semiconductor element test device comprising:
a test board configured to electrically connect with a device under test (DUT);
a test tray including an input port configured to receive the DUT to fix the DUT to the test board;
a pusher including a pusher end and a pusher body, the pusher end separating the test tray from the pusher body, the pusher end configured to penetrate the input port to come into contact with the DUT, the pusher body configured to transfer heat to the DUT through the pusher end;
a porous match plate having the pusher body on a pusher arrangement region thereof with a plurality of holes adjacent to the pusher arrangement region;
a heater on an upper surface of the porous match plate, the heater configured to control a temperature of the pusher;
an airflow input port on the heater, the airflow input port configured to provide airflow to the plurality of holes; and
a variable flow tunnel configured to transport the airflow between the airflow input port and the heater such that a length of the variable flow tunnel between the airflow input port and the heater is variable as the airflow passes through the variable flow tunnel, through the plurality of holes, and through a separated space between the test tray and the pusher body.

17. The semiconductor element test device of claim 16, wherein
the DUT includes a first DUT in a central region of the test tray, and a second DUT in an outer region of the test tray,
the pusher includes a first pusher on the first DUT, and a second pusher on the second DUT such that the second pusher is spaced apart from the first pusher,
the heater includes a central heater on the first pusher, and an outer heater on the second pusher, the central heater and the outer heater being independently operable to independently control the temperature of each of the first pusher and the second pusher.

18. The semiconductor element test device of claim 16, wherein the heater includes heater holes at least partially overlapping with the plurality of holes from a planar viewpoint and through which the airflow passes such that the temperature of the airflow is controlled by the heater, while the airflow passes through the heater holes.

19. The semiconductor element test device of claim 16, further comprising:
a suction port symmetrically on side walls of the test board and the test tray, the suction port configured to discharge the airflow passing through the separated space between the test tray and the pusher body; and
a bidirectional centrifugal blower on the variable flow tunnel, the bidirectional centrifugal blower configured to suck the airflow discharged through the suction port and to supply the airflow toward the test board.

20. The semiconductor element test device of claim 19, wherein the bidirectional centrifugal blower is configured to supply the airflow such that the temperature of the airflow is lower than the temperature of the pusher to cool the pusher and higher than the temperature of the test tray to heat the test tray.

* * * * *